(12) United States Patent
Zhang et al.

(10) Patent No.: US 12,256,612 B2
(45) Date of Patent: Mar. 18, 2025

(54) DISPLAY PANEL AND DISPLAY DEVICE

(71) Applicant: Shanghai Tianma Micro-Electronics Co., Ltd., Shanghai (CN)

(72) Inventors: Jing Zhang, Shanghai (CN); Feng Lu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 634 days.

(21) Appl. No.: 17/674,613

(22) Filed: Feb. 17, 2022

(65) Prior Publication Data
US 2023/0030378 A1 Feb. 2, 2023

(30) Foreign Application Priority Data
Jul. 30, 2021 (CN) .................. 202110874972.3

(51) Int. Cl.
*H10K 59/131* (2023.01)
*G06F 3/044* (2006.01)
*H10K 50/844* (2023.01)
*H10K 59/40* (2023.01)

(52) U.S. Cl.
CPC ......... *H10K 59/131* (2023.02); *G06F 3/0448* (2019.05); *H10K 50/844* (2023.02); *H10K 59/40* (2023.02)

(58) Field of Classification Search
None
See application file for complete search history.

(56) References Cited

U.S. PATENT DOCUMENTS

2021/0257592 A1* 8/2021 Lee .................. G06F 3/0412

FOREIGN PATENT DOCUMENTS

WO 2021147851 A1 7/2021

* cited by examiner

*Primary Examiner* — Kyoung Lee
(74) *Attorney, Agent, or Firm* — Anova Law Group, PLLC

(57) ABSTRACT

A display panel and a display device are provided. The display panel includes a display area, a light transmission area, a first frame area, a crack detection line in the first frame area, and two first connection lines. The first frame area surrounds the light transmission area and the display area surrounding the first frame area. At least a portion of the crack detection line extends along a circumferential direction of the light transmission area. The crack detection line is connected to the two first connection lines. Each first connection line of the two first connection lines includes a first end connected to the crack detection line and a second end away from the first end. A distance between two first ends of the two first connection lines is larger than a distance between two second ends of the two first connection lines.

23 Claims, 32 Drawing Sheets

US 12,256,612 B2

DISPLAY PANEL AND DISPLAY DEVICE

CROSS-REFERENCE TO RELATED APPLICATION

This application claims the priority of Chinese Patent Application No. 202110874972.3, filed on Jul. 30, 2021, the content of which is incorporated herein by reference in its entirety.

TECHNICAL FIELD

The present disclosure generally relates to the field of display technologies and, more particularly, relates to a display panel and a display device.

BACKGROUND

Almost all mobile phone cameras on the market are placed above screens presently. Because a camera has a certain size, it often occupies a large frame on a whole device, which seriously affects a screen-to-body ratio. As the mobile phone market favors full-screen displays, products where holes are punched in display areas and cameras are disposed in opening areas have been conceived and have been highly sought after in recent years.

However, technical developments of punching the holes in the display areas face various problems. For example, cracks are prone to occur when cutting the display areas, and the cracks can easily extend to the effective display areas in the subsequent process, causing package failure and reducing the reliability of the display products. Therefore, it is necessary to use a crack detection function of crack detection lines in time to detect and intercept cracks, ensuring product quality.

SUMMARY

One aspect of the present disclosure provides a display panel. The display panel includes a display area, a light transmission area, a first frame area, a crack detection line in the first frame area, and two first connection lines. The first frame area surrounds the light transmission area and the display area surrounding the first frame area. At least a portion of the crack detection line extends along a circumferential direction of the light transmission area. The crack detection line is connected to the two first connection lines. Each first connection line of the two first connection lines includes a first end connected to the crack detection line and a second end away from the first end. A distance between two first ends of the two first connection lines is larger than a distance between two second ends of the two first connection lines.

Another aspect of the present disclosure provides a display device. The display device includes a display panel. The display panel includes a display area, a light transmission area, a first frame area, a crack detection line in the first frame area, and two first connection lines. The first frame area surrounds the light transmission area and the display area surrounding the first frame area. At least a portion of the crack detection line extends along a circumferential direction of the light transmission area. The crack detection line is connected to the two first connection lines. Each first connection line of the two first connection lines includes a first end connected to the crack detection line and a second end away from the first end. A distance between two first ends of the two first connection lines is larger than a distance between two second ends of the two first connection lines.

In the display panel and the display device provided by the present disclosure, the first connecting lines may be located in the first frame area. Each of the first connecting line may include a first end connected to the crack detection line and a second end away from the first end. The distance between the two first ends may be larger than the two second ends. A small distance between the two second may be beneficial for the subsequent connecting line connected with the second end of the first connecting line to be led to the display area, reducing the occupied space of the distance between the two first connecting lines in the first frame. The impact on other components in the first frame may also be reduced. For example, the influence on the compensation module provided in the first frame for compensating the irregularly-shaped touch-control electrodes may be reduced, or the influence on the part of the touch-control wire extending through the first frame for connecting the plurality of touch-control electrodes may be reduced. Also, a large distance between the two first ends can effectively increases the distance between the two first connection lines, thereby reducing the risk of short circuit between the two first connection lines, and effectively avoiding the failure of the crack detection function.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
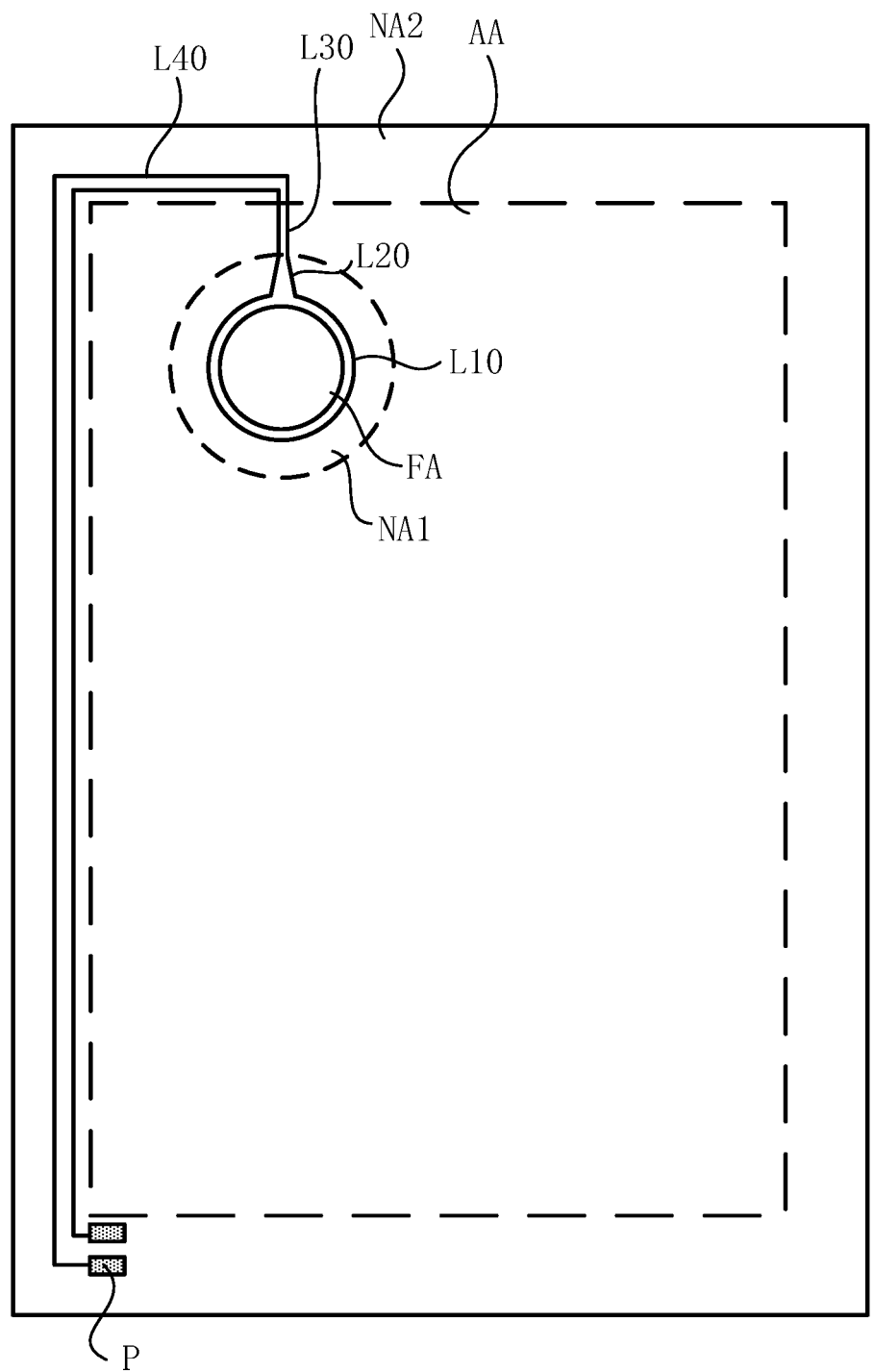
FIG. 1 illustrates a schematic plan view of an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

The present disclosure provides a display panel. In one embodiment shown in FIG. 1 which is a plan view of the display panel and FIG. 2 which is a local plan view of the display panel in FIG. 1, the display panel may include a display area AA, a light transmission area FA, and a first frame area NA1. The first frame area NA1 may be disposed surrounding the light transmission area FA, and the display area AA may be disposed surrounding the first frame area NA1. The light transmission area FA may provide space for accommodating modules including cameras or sensors in the display device. In the fabrication process, a specific part of the display panel may be cut to form the light transmission area FA. In one embodiment, the light transmission area may be an opening area.

The display panel may further include a crack detection line L10. The crack detection line L10 may be located in the first frame area NA1 and at least a portion of the crack detection line L10 may extend upward along a circumferential direction of the light transmission area FA. When the crack detection line L10 is complete and continuous without disconnection, by detecting the electrical signals at both ends of the crack detection line L10, it can be detected that the crack detection line L10 has a certain resistance value. When the display panel is cut to form the light transmission area FA and cracks appear in the process causing the crack detection line L10 to be broken at positions of the cracks, the resistance value of the crack detection line L10 can be detected to increase. Therefore, by detecting the resistance value change of the crack detection line L10, it can be detected whether the crack detection line L10 has a disconnection phenomenon, and then whether there are cracks extending to the display area AA at the edge of the light transmission area FA. That is, the crack detection may be realized.

The display panel also includes first connection lines L20. The crack detection line L10 may be connected to two first connection lines L20. Two ends of the crack detection line L10 may be respectively connected to one of the two first connection lines L20. The electrical signals at each of the two ends of the crack detection line L10 may be respectively transmitted through corresponding one of the two first connection lines L20 connected to it. To increase the detection range, the crack detection line L10 may need to surround as many sections as possible around the edge of the light transmission area FA, and correspondingly, both ends of the crack detection line L10 may be located on a same side of the light transmission area FA. For example, both ends of the crack detection line L10 may be located between the light transmission area FA and the upper frame, where the upper frame is a part of the frame surrounding the display area that is far from a driving chip. Or both ends of the crack detection line L10 may also be located between the light transmission area FA and the lower frame, where the lower frame is the part of the frame surrounding the display area that is close to the side of the driver chip. Of course, both ends of the crack detection line L10 can also be located in other sides of the light transmission area FA and the present disclosure has no limit on this.

In some other embodiments, each of the first connecting line L20 may include a first end A connected to the crack detection line L10. Since the crack detection line L10 is connected to the two first connection lines L20, the crack detection line L10 may include two first ends A. The two first ends A may be located on the same side of the light transmission area FA. For example, the two first ends A may both be located between the light transmission area FA and the upper frame, where the upper frame is a part of the frame surrounding the display area that is far from the driving chip, or the two first ends can also be located between the aperture area FA and the lower frame, where the lower frame is the part of the frame surrounding the display area that is close to the side of the driver chip. Of course, the two first ends A can also be located on other sides of the light transmission area FA and the present disclosure has no limit on this.

In some other embodiments, positions in the crack detection line L10 connected to the first connection lines L20 may be other positions in the crack detection lines L10 instead of the ends of the crack detection lines L10. Optionally, the two first ends A may be located at a same side of the light transmission area FA, and the positions of the two first ends A may be similar to previous embodiments. Further, optionally, the crack detection line L10 may be non-closed surrounding the light transmission area FA.

Optionally, each of the first connection lines L20 may include a first end connected to the crack detection line L10 and a second end B away from the first end A. A distance between two first ends A of the first connection lines L20 may be larger than a distance between two second ends B.

In the existing technologies, there are problems that the crack detection lines cannot detect cracks and the crack detection function fails. To improve the problems that the crack detection lines cannot detect cracks in the existing technologies, the existing technologies are studied.

In a display panel in exiting technologies, the two first connecting lines connected to the two ends of the crack detection line are parallel to each other, and the distance between the two first connecting lines is the same as the two in the present disclosure. The distance between the second ends is the same, that is, the distance between the two first connecting lines is smaller. Since the first connecting lines are at least partially located in the first frame area and the flatness of the first frame area is poor, film layer residuals are prone to occur in the first frame area. Further, the position in the first frame area closer to the light transmission area has poorer flatness, such that the position in the first frame area closer to the light transmission area is more likely to cause the problem of film layer residuals. Therefore, a short circuit is likely to occur between the two first connecting lines with a small distance in the display panel in the existing technologies. When a short circuit is prone to occur between the two first connecting lines and the crack detection line is detected through the two first connecting lines, even if the crack detection line is broken, the detected resistance value does not change much. Correspondingly, the crack detection cannot be achieved.

In the display panel provided by the present disclosure, the first connecting lines L20 may be located in the first frame area NA1. Each of the first connecting lines L20 may include a first end A connected to the crack detection line L10 and a second end B away from the first end A. A distance between two first ends A of the first connection lines L20 may be larger than a distance between two second ends B. A smaller distance between the two second ends B may be beneficial to the subsequent connection lines connected to the second end B of the first connection lines L20 to be led to the display Area AA reduces the occupied area of the first frame NA1 between the two first connecting lines L20. The impact on other components in the first frame NA1 may be reduced. For example, the impact on the compensation module for compensating the irregular touch-control electrodes provided in the first frame NA1 or the impact on a portion of the touch-control wires extending through the first frame NA1 for connecting the touch-control electrodes may be reduced. At the same time, the distance between the two first ends A is relatively large, effectively increasing the distance between the two first connecting lines L20, to reduce the risk of short circuit between the two first connecting lines L20 and prevent the crack detection function from failure.

Figure 2:
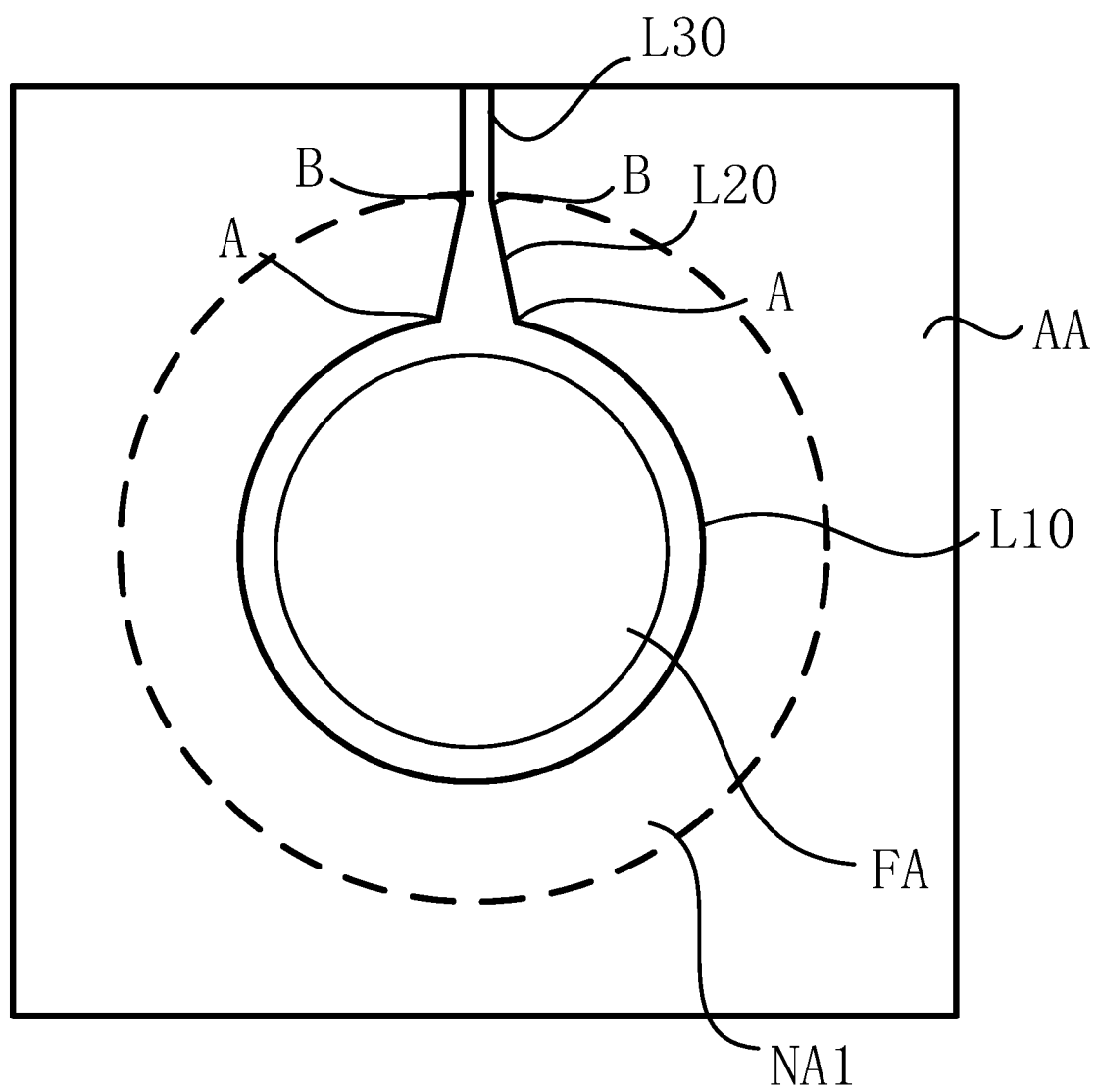
FIG. 2 illustrates a partial plan view of the display panel in FIG. 1.

In some embodiments, as shown in FIG. 1 and FIG. 2, the display panel may further include two second connection lines L30. Each of the two second connection lines L30 may be connected to a second end of corresponding one of the second connection lines L20. The second connection lines L30 may be located in the display area AA. Electrical signals at two ends of the crack detection line L10 may be transmitted through the first connection lines L20 and the second connection lines L30 connected to it.

In some embodiments, as shown in FIG. 1 and FIG. 2, the display panel may further include a second frame area NA2. The display area AA may be used for display. The second frame area NA2 may not be used for display but for accommodating structures including circuit elements or wires.

The display panel may further include third connection lines L40 and at least two detection soldering pads P. The third connection lines L40 and the at least two detection soldering pads P may be located in the second frame area NA2. The two second connection lines L30 may be connected to different soldering pads P of the at least two detection soldering pads P through different third connection lines L40 respectively. Each of the two second connection lines L30 may be connected to a second end of corresponding one of the first connection lines L20, and the two ends of the crack detection line L10 may be connected to different first connection lines L20 respectively. Correspondingly, when the crack detection line L10 is complete and continuous without disconnection, it can be detected that the crack detection line L10 has a certain resistance value through the at least two detection pads P. When the display panel is cut to form the light transmission area FA and cracks appear to make the crack detection line L10 broken at the positions of the cracks, it can be detected that the resistance value of the crack detection line L10 increases through the at least two detection pads P. Therefore, the change of the resistance value of the crack detection line L10 can be detected through the two detection pads P, that is, it can be detected whether the crack detection line L10 has a disconnection phenomenon, and then whether there is a crack extending to the display area AA at the edge of the light transmission area FA. Correspondingly, the crack detection can be achieved quickly and effectively.

Figure 3:
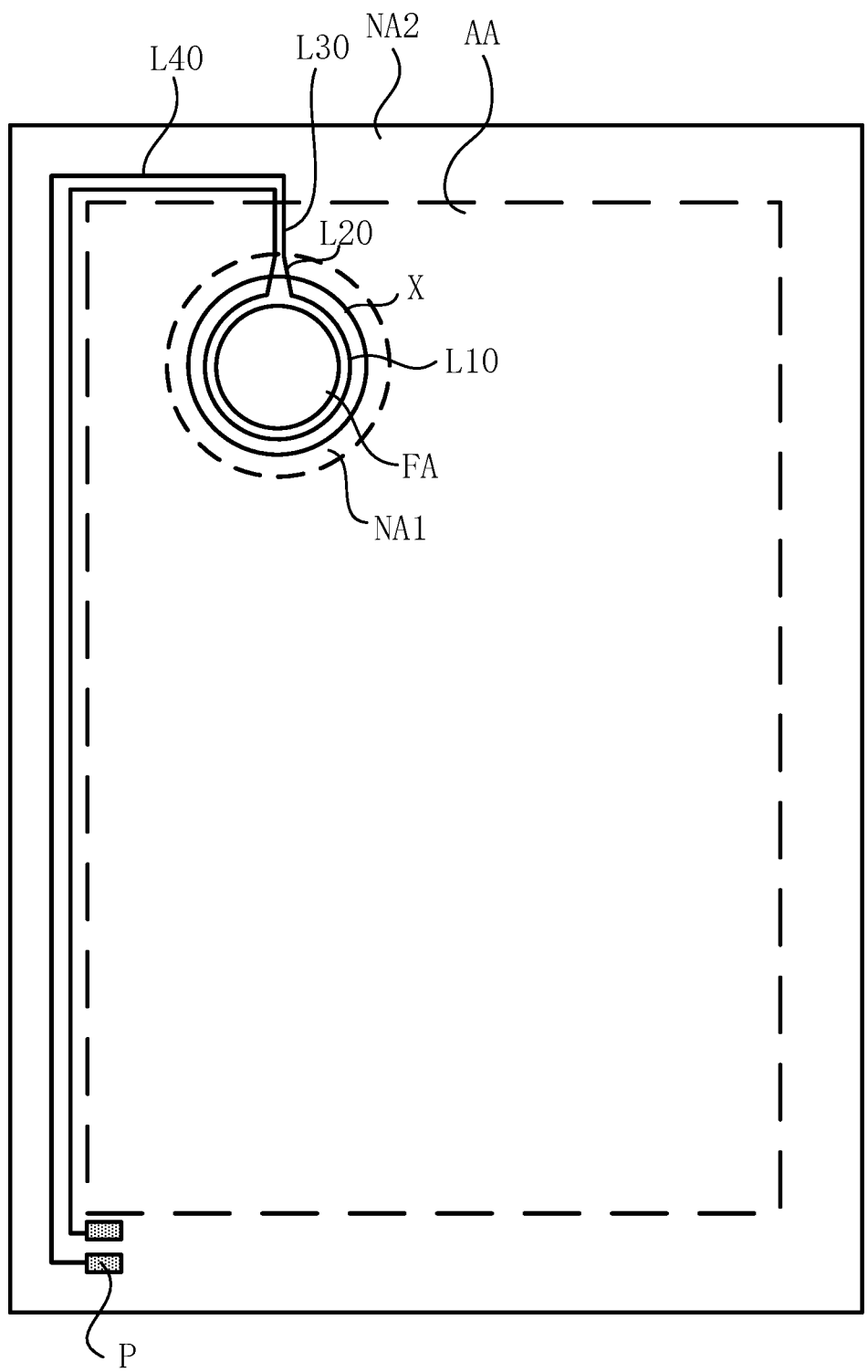
FIG. 3 illustrates a schematic plan view of another exemplary display panel consistent with various disclosed embodiments in the present disclosure.
Figure 4:
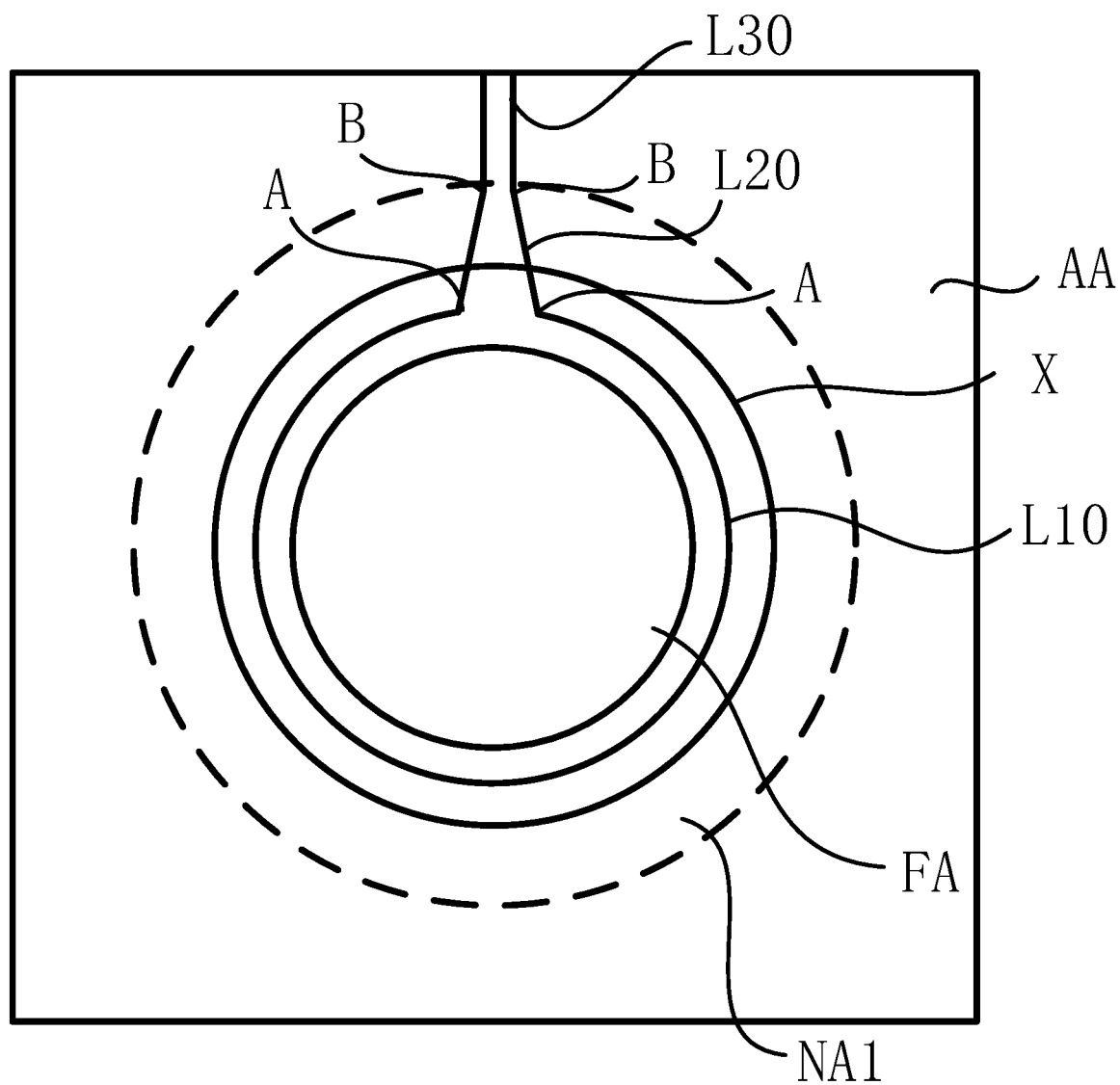
FIG. 4 illustrates a partial plan view of the display panel in FIG. 3.

The present disclosure also provides another display panel. As shown in FIG. 3 which is a plan view of the display panel provided by another embodiment of the present disclosure, and FIG. 4 which is a local view of the display panel in FIG. 3, the display panel may further include a step structure X. The step structure X may be located in the first frame area NA1 and surround the light transmission area FA. In various embodiments, the step structure X can be non-closed around the light transmission area FA or be closed around the light transmission area FA.

Optionally, the step structure X may be one or a combination of grooves or protrusions. When the step structure X is a combination of grooves and protrusions, the step structure X may be a nested structure in which one of the grooves and protrusions surrounds the other, such that the step structure X surrounds the light transmission area FA as a whole.

Optionally, the step structure X can also be multiple combinations of a same structure. In this case, the combination position relationship of the step structure X can refer to the above-mentioned nested structure.

Optionally, the step structure X may be barrier walls and/or the grooves described in the embodiment of the present disclosure.

Optionally, the step structure X may include a plurality of sub-segments, and the plurality of sub-segments may be arranged along the axial direction surrounding the light transmission area FA.

Optionally, the crack detection line L10 may be located between the step structure X and the light transmission area FA. In a direction perpendicular to the display panel, the first connection lines L20 may overlap the step structure X, and the step structure X may be an uneven structure. Since the problem of film layer residue is prone to occur at the step structure X, by increasing the distance between the two first connection lines L20, the risk of a short circuit between the two first connection lines L20 at the step structure X may be reduced, effectively avoiding failure of the crack detection function.

Figure 5:
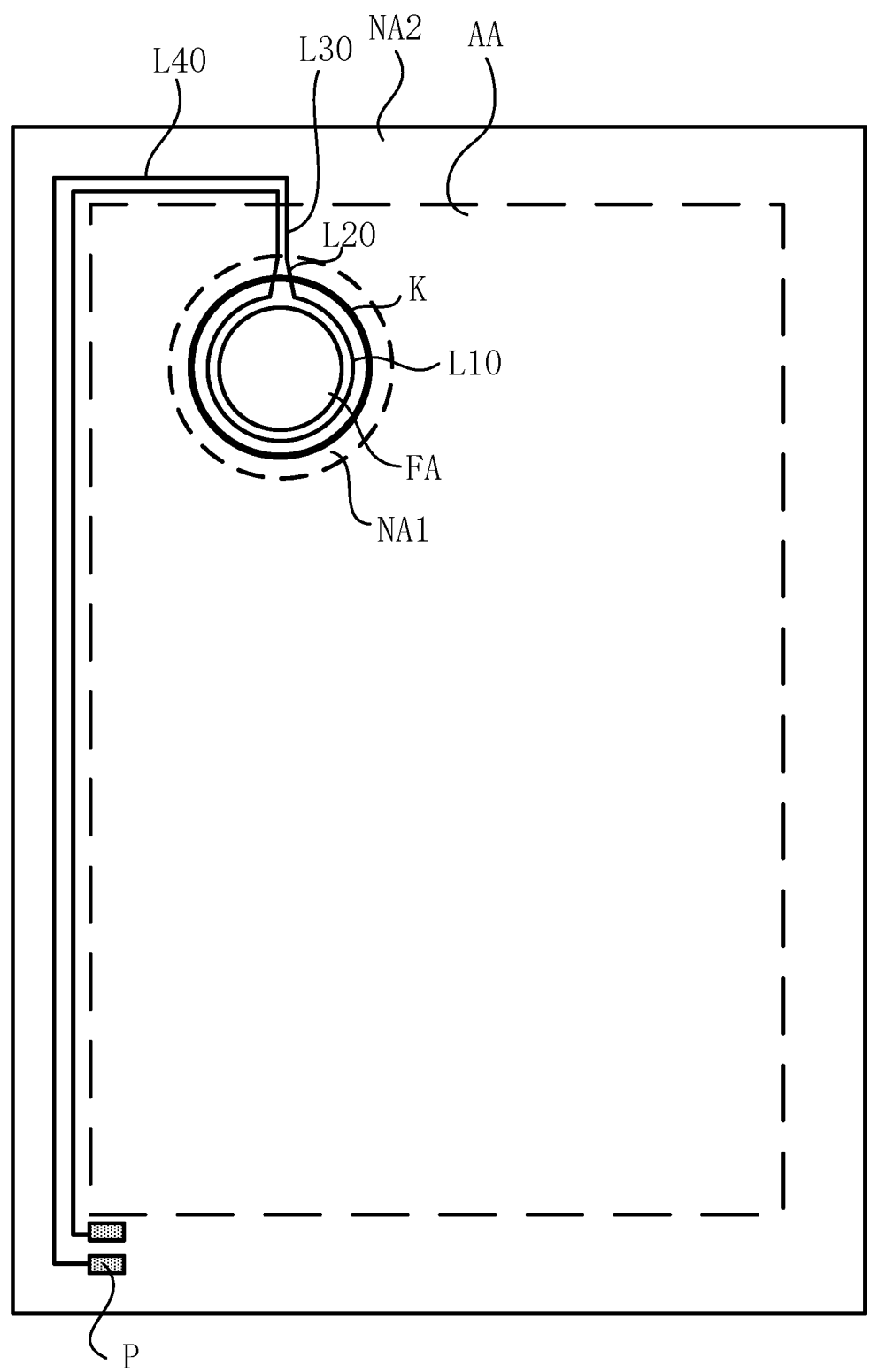
FIG. 5 illustrates a schematic plan view of another exemplary display panel consistent with various disclosed embodiments in the present disclosure.

The present disclosure also provides another display panel. As shown in FIG. 5 which is a plan view of the display panel provided by the present embodiment and FIG. 6 which is a local plan view of the display panel in FIG. 5, the display panel may further include a barrier wall K disposed in the first frame area NA1. The barrier wall K may surround the light transmission area FA. Since the height of the barrier wall K may be relatively high in the direction perpendicular to the display panel, the film layers formed on the barrier wall K may easily form step difference at the barrier wall K, thereby forming a step structure. At angles between the step structure formed on the barrier wall K, underexposure may be prone to occur, such that large-area etching residues may be prone to occur in the area near the barrier wall K.

The crack detection line L10 may be located between the barrier wall K and the light transmission area FA. In the direction perpendicular to the display panel, the first connecting lines L20 may partially overlap the barrier wall K. In the area close to the barrier wall K, the two first connection lines L20 may be prone to short circuits. By increasing the distance between the two first connecting lines L20 in the area close to the barrier wall K, the risk of a short circuit between the two first connecting lines L20 in the area close to the barrier wall K may be effectively reduced, and the crack detection function may be effectively prevented from being invalid.

Figure 6:
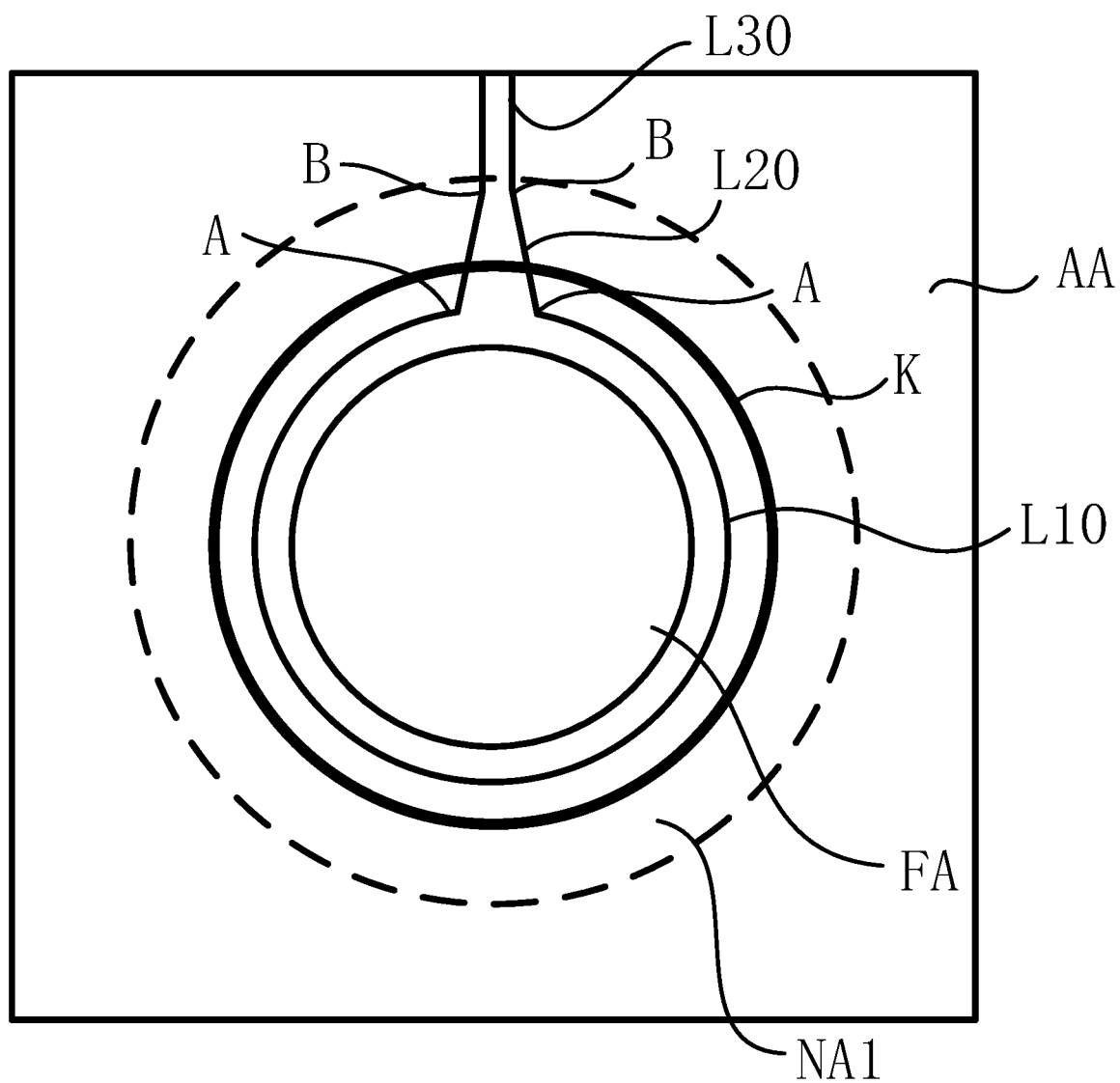
FIG. 6 illustrates a partial plan view of the display panel in FIG. 5.

In some embodiments, as shown in FIG. 5 and FIG. 6, a distance between the two first ends A may be larger than a distance between the two second ends B. Further, along a direction from the first ends A to the second ends B, the two first connection lines L20 may extend in directions gradually approaching each other. There may be no need to bend the first connecting lines L20, which effectively simplifies the difficulty of setting the first connecting lines L20, improves production efficiency, and reduces production costs. Also, in the circumferential direction of the light transmission area FA, the distance between the parts of the two first connecting lines L20 except the second ends B may be greater than the distance between the two second ends B. Correspondingly, the distance between the two first connecting lines L20 may be increased effectively while the setup of the subsequent connection lines connected to the second ends of the first connection lines L20 (for example, the second connection lines L30 connected to the second ends of the first connection lines L20), effectively reducing the risk of a short circuit between the two first connecting lines L20 and avoiding the failure of the crack detection function.

Figure 7:
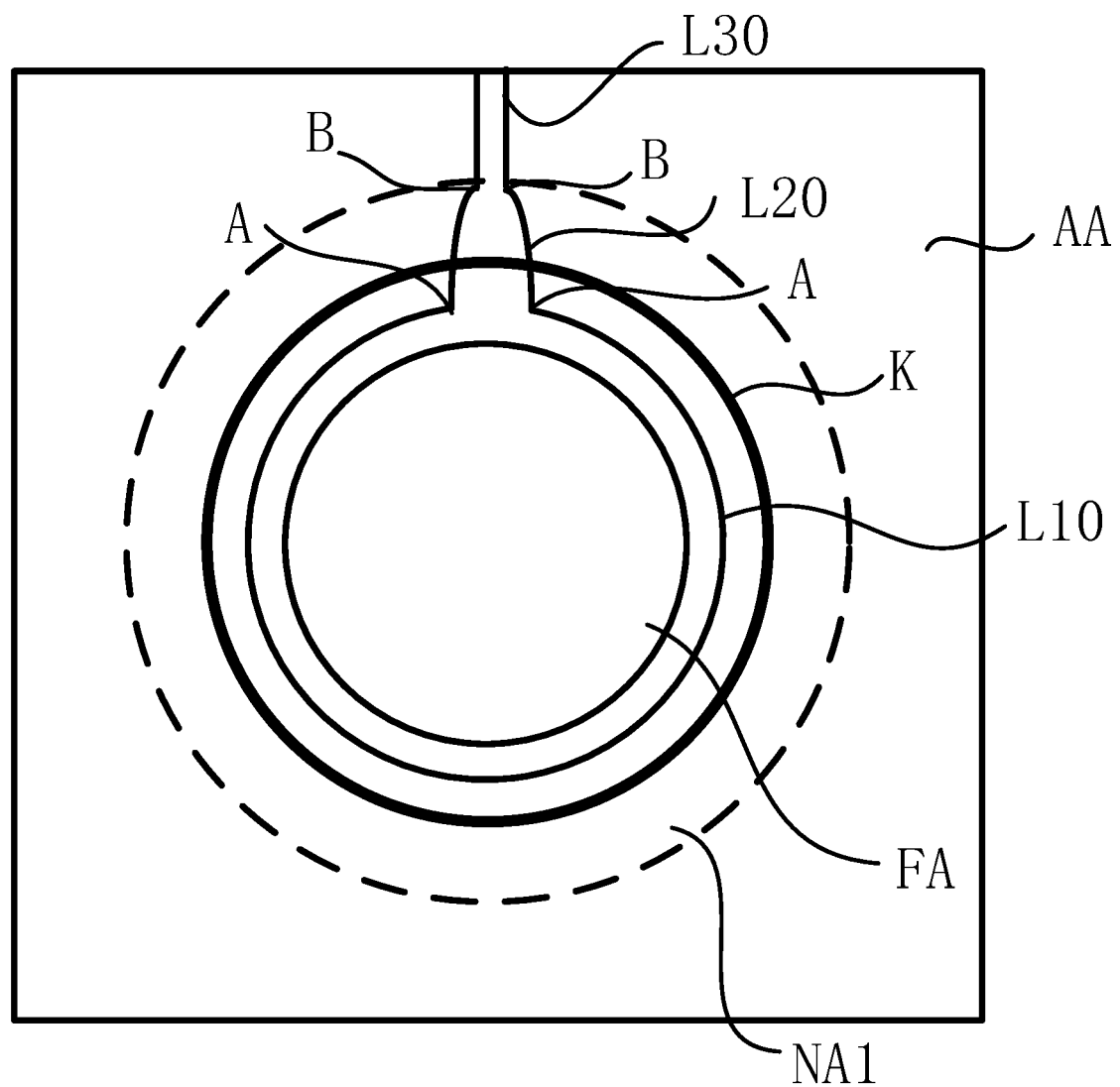
FIG. 7 illustrates a partial plan view of another exemplary display panel consistent with various disclosed embodiments in the present disclosure.

For description purposes only, the embodiments in FIG. 5 and FIG. 6 where the first connection lines L20 are straight lines are used as examples to illustrate the present disclosure, and do not limit the scope of the present disclosure. In various embodiments, the first connection lines L20 may have any suitable shapes, and the present disclosure has no limit on this. For example, in some embodiments in FIG. 7, the first connection lines L20 may be arcs.

As shown in FIG. 5 and FIG. 6, in some other embodiments, the first ends A may be located between the barrier wall K and the light transmission area FA, and the second ends B may be located between the barrier wall K and the display area AA. The distance between the two first ends A may be larger than the distance between the two second ends B, and the two first connection lines may approach each other gradually along a direction from the first ends A to the second ends B. Therefore, in the direction perpendicular to the display panel, a distance between the interface of the first connecting lines L20 and the barrier wall K may be larger than the distance between the two second ends B, thereby realizing an increase in the distance between the two first connecting lines L20 near the barrier wall K. The risk of a short circuit between the two first connecting lines L20 in the area close to the barrier wall K may be effectively reduced, avoiding the failure of the crack detection function.

It should be noted that "the first structure is located between the second structure and the third structure" in the present disclosure means that "the vertical projection of the first structure on the base substrate is located between the vertical projection of the second structure on the base substrate and the vertical projections of the third structure on the base substrate". For example, "the first ends A are located between the barrier wall K and the light transmission area FA" can be understood as "the vertical projections of the first ends A on the base substrate are located between the vertical projection of the barrier wall K on the base substrate and the vertical projections of the light transmission area FA on the base substrate. Similarly, "the second ends B are located between the barrier wall K and the display area AA" can be understood as "the vertical projections of the second ends B on the base substrate are located between the vertical projection of the barrier wall K on the base substrate and the vertical projection of the display area AA on the base substrate. In other embodiments of the present disclosure, the related descriptions are also applicable, and the present disclosure will not be repeated.

Figure 8:
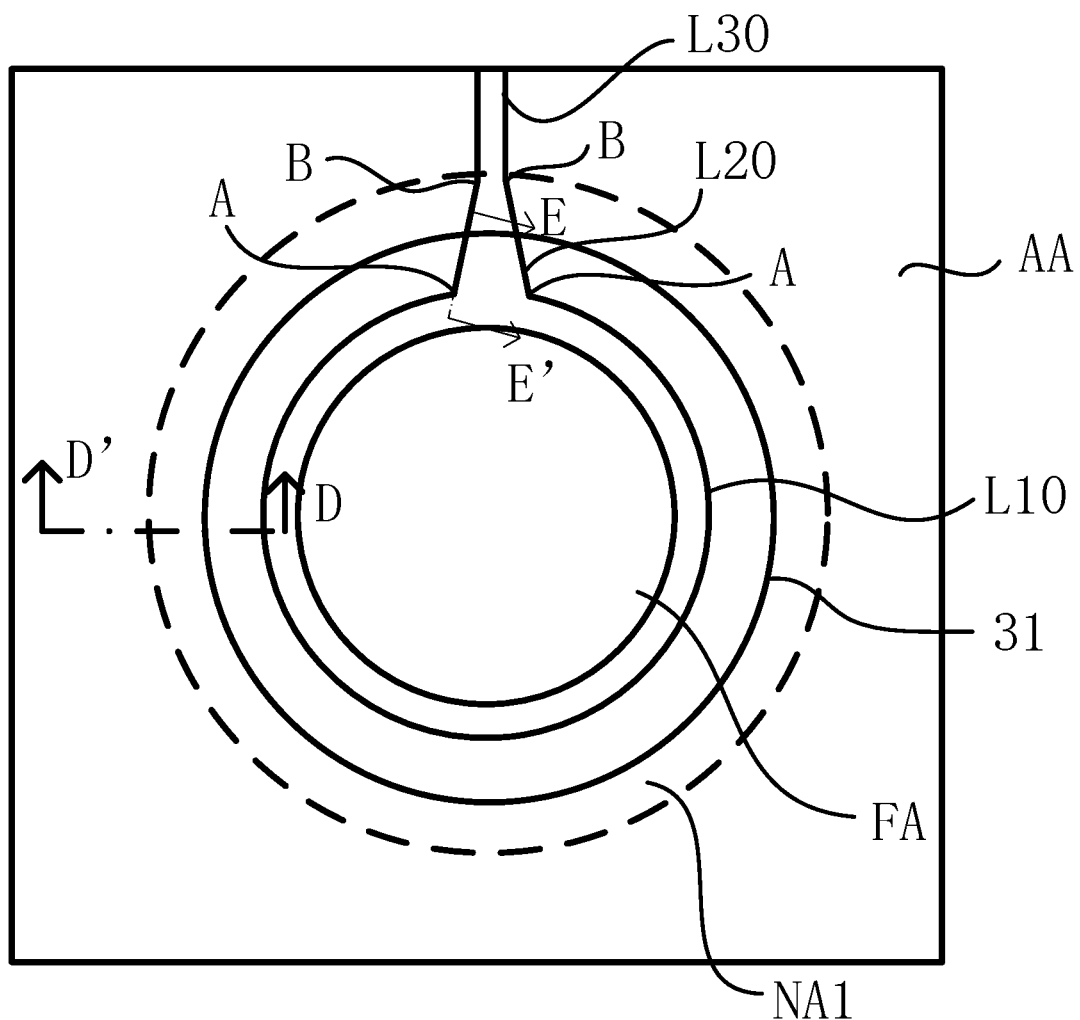
FIG. 8 illustrates a partial plan view of another exemplary display panel consistent with various disclosed embodiments in the present disclosure.
Figure 9:
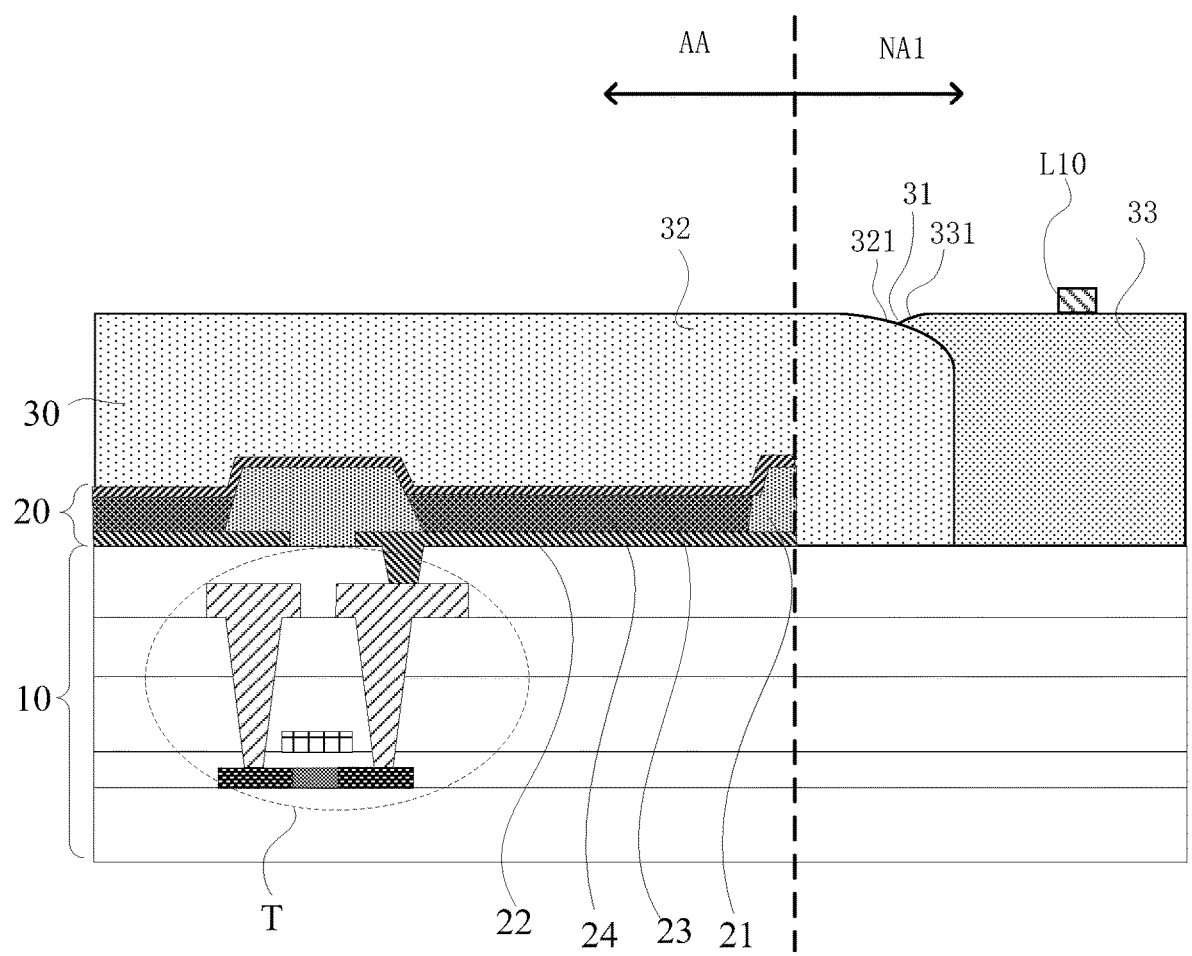
FIG. 9 illustrates a sectional view of the display panel in FIG. 8 along a D-D' direction.
Figure 10:
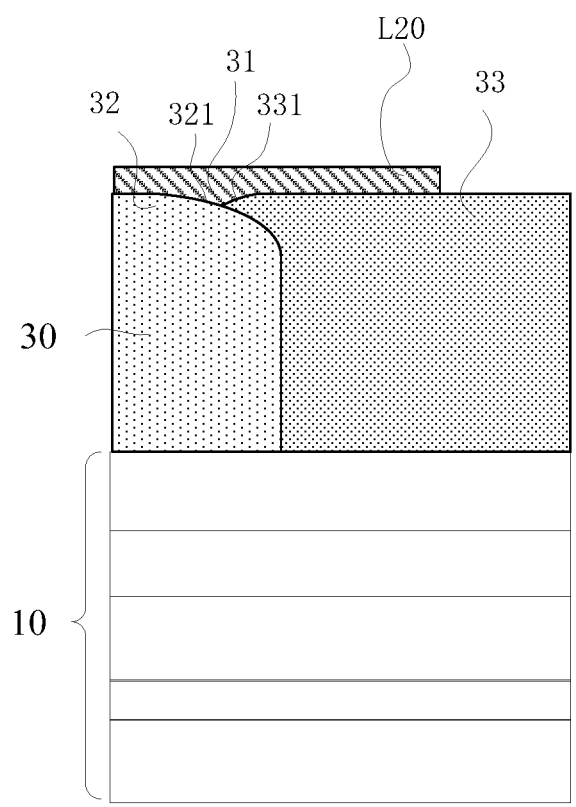
FIG. 10 illustrates a sectional view of the display panel in FIG. 8 along an E-E' direction.

One embodiment of the present disclosure also provides another display panel. FIG. 8 is a partial plan view of the display panel provided by the present embodiment, FIG. 9 is a cross-sectional view of the display panel along D-D' of FIG. 8, and FIG. 10 is a cross-sectional view of the display panel along E-E'. The cross-section along D-D' refers to a cross-section perpendicular to the D direction and perpendicular to the direction of the base substrate. In related embodiments of the present disclosure, the related descriptions are also applicable. As shown in FIGS. 8-10, in some optional embodiments, the display panel may further include a base substrate 10, a light-emitting layer 20, and an encapsulation layer 30 arranged in sequence. Optionally, the base substrate 10 may include a base and a pixel circuit disposed between the base and the light-emitting layer 20. The pixel circuit may include thin film transistors T. The light-emitting layer 20 may include a pixel-defining layer 21 and an organic light-emitting device. The organic light-emitting device may include an anode 22, a cathode 23, and an organic light-emitting material 24 located between the anode 22 and the cathode 23. The encapsulation layer 30 may include a thin-film encapsulation structure formed by alternately stacking several inorganic layers and organic layers to encapsulate the organic light-emitting device. Exemplarily, the encapsulation layer 30 may be an encapsulation structure of an inorganic layer-organic layer-inorganic stack layer. The crack detection line L10 and the first connection lines L20 may be located on a side of the encapsulation layer 30 away from the base substrate 10.

As shown in FIGS. 8-10, in some embodiments, a side surface of the encapsulation layer 30 away from the base substrate 10 may be recessed toward the base substrate 10 to form a groove 31. Subsequent film layers formed on the side of the encapsulation layer 30 away from the base substrate 10 may be prone to a step difference at the groove 31 and underexposure may be prone to occur. A large area of etching residue may be likely to occur at the groove 31.

The groove 31 may be located in the first frame area NA1, the crack detection line L10 may be located between the groove 31 and the light transmission area FA. The first ends A may be located between the groove 31 and the light transmission area FA, and the second ends B may be located between the groove Between and the display area AA. In the direction perpendicular to the display panel, the first connecting line L20 and the groove 31 may partially overlap, and a short circuit may be likely to occur between the two first connecting lines L20 at the groove 31. By increasing the distance between the two first connecting lines L20 at the groove 31, the risk of a short circuit between the two first connecting lines L20 at the groove 31 may be effectively reduced, and the failure of the crack detection function may be effectively avoided.

In some embodiments, as illustrated in FIGS. 8-10, the encapsulation layer 30 may include a first encapsulation layer 32 and a second encapsulation layer 33. The first encapsulation layer 32 may surround the second encapsulation layer. The first encapsulation layer 32 may be located in the display area AA and extend into the first frame area NA1, to protect the organic light-emitting device in the display area AA and prevent water vapor from entering the organic light-emitting device. The second encapsulation layer 33 may be located in the light transmission area FA and extend into a portion of the first frame area NA1. The encapsulation layer 33 may cover a portion of the first encapsulation layer 32, to prevent the water vapor from entering through edges where the film layers in the first encapsulation layer 32 ends and further protect the organic light-emitting device in the display area AA.

Interfaces of the first encapsulation layer 32 and the second encapsulation layer 33 may be located in the first frame area NA1. The interfaces of the first encapsulation layer 32 and the second encapsulation layer 33 may be edges where the film layer of the second encapsulation layer 33 is cut off, and the groove 31 may be located at the interfaces between the first encapsulation layer 32 and the second encapsulation layer 33.

For description purposes only, the embodiments in FIG. 9 and FIG. 10 where the interfaces of the first encapsulation layer 32 and the second encapsulation layer 33 are the edges where the film layer of the second encapsulation layer 33 is cut off, are used as examples to illustrate the present disclosure, and do not limit the scope of the present disclosure. In some other embodiments, when the first encapsulation layer partially covers the second encapsulation layer, the boundary between the first encapsulation layer and the second encapsulation layer may be the edges where the film of the first encapsulation layer cuts off. In some other embodiments, when the edges where the film layer of the first encapsulation layer is cut off is same as the edges where the film layer of the second encapsulation layer is cut off, the boundary between the first encapsulation layer and the second encapsulation layer may be the cut-off edge of the first encapsulation layer and the cut-off edge of the second encapsulation layer.

As shown in FIGS. 8-10, in some embodiments, a process for forming the first encapsulation layer 32 may be before a process for forming the second encapsulation layer 33. At least a portion of the second encapsulation layer 33 may be disposed at a side of the first encapsulation layer 32 away from the base substrate 10.

Along a direction from the display area AA to the light transmission area FA, the first encapsulation layer 32 may include a first inclined surface 321 located on a side of the first encapsulation layer 32 close to the second encapsulation layer 33. The first inclined surface 321 may be located on a side of the first encapsulation layer 32 away from the base substrate 10. Along the direction from the display area AA to the light transmission area FA, the first inclined surface 321 may be gradually inclined toward the direction close to the base substrate 10. That is, along a direction from the display area AA to the light transmission area FA, the thickness of the portion of the first encapsulation layer 32 corresponding to the first inclined surface 321 in the direction perpendicular to the display panel may gradually decrease.

The second encapsulation layer 33 may cover a portion of the first inclined surface 321. Along a direction from the light transmission area FA to the display area AA, the second encapsulation layer 33 may include a second inclined surface 331 located on aside of the second encapsulation layer 33 close to the first encapsulation layer 32. The second inclined surface 331 may be located on a side of the second encapsulation layer 33 away from the base substrate 10. Along the direction from the light transmission area FA to the display area AA, the second inclined surface 331 may be gradually inclined toward the direction close to the base substrate 10. That is, along the direction from the light transmission area FA to the display area AA, the thickness of a portion of the second encapsulation layer 33 corresponding to the second inclined surface 331 in the direction perpendicular to the display panel may gradually decrease.

In the direction perpendicular to the display panel, the first inclined surface 321 and the second inclined surface 331 may partially overlap. Along a direction from the display area AA to the light transmission area FA, the thickness of the portion of the first encapsulation layer 32 corresponding to the first inclined surface 321 in the direction perpendicular to the display panel may gradually decrease. Along the direction from the light transmission area FA to the display area AA, the thickness of a portion of the second encapsulation layer 33 corresponding to the second inclined surface 331 in the direction perpendicular to the display panel may gradually decrease. Correspondingly, the groove 31 may be formed between the first encapsulation layer 32 and the second encapsulation layer 33.

Figure 11:
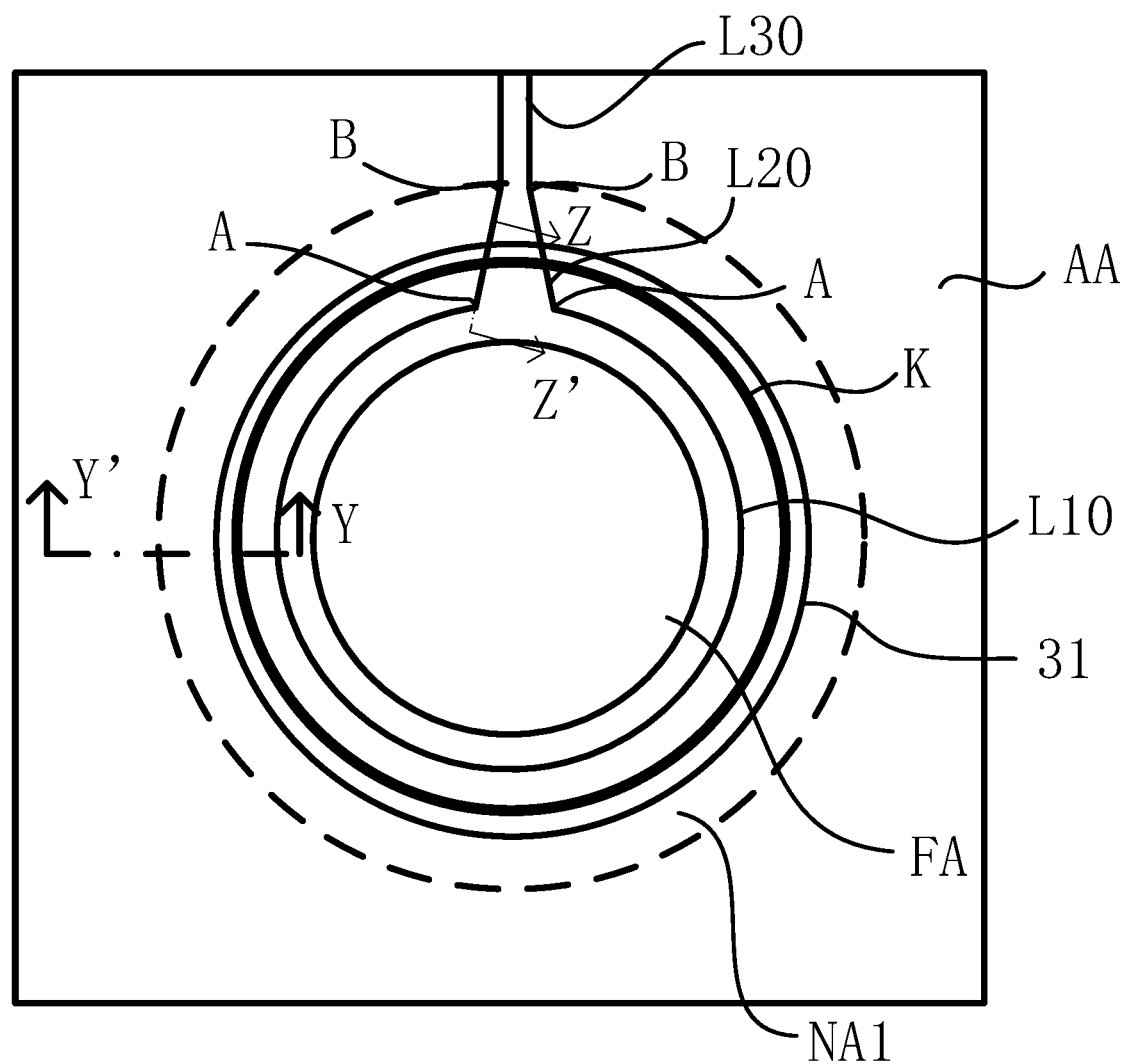
FIG. 11 illustrates a partial plan view of another exemplary display panel consistent with various disclosed embodiments in the present disclosure.
Figure 12:
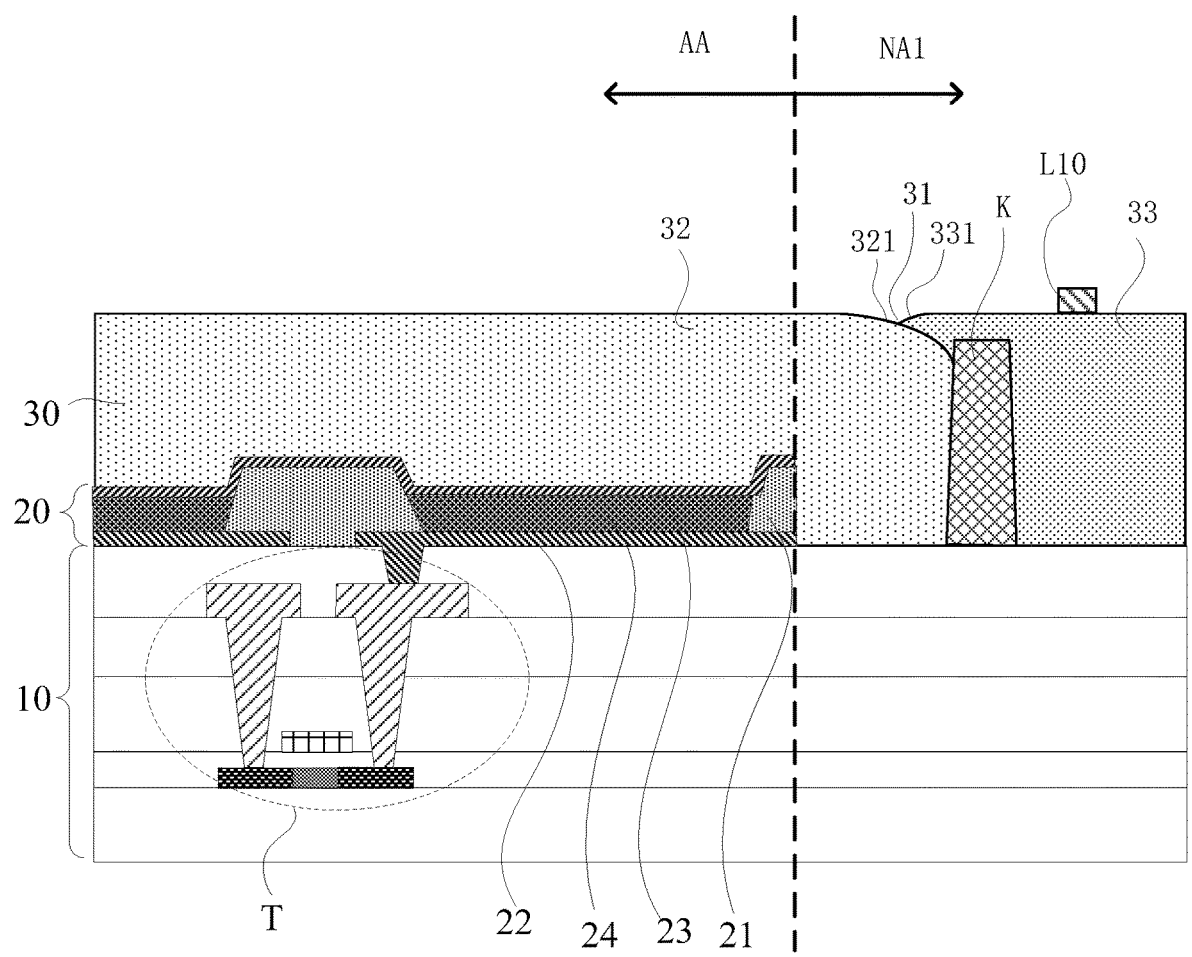
FIG. 12 illustrates a sectional view of the display panel in FIG. 11 along a Y-Y' direction.
Figure 13:
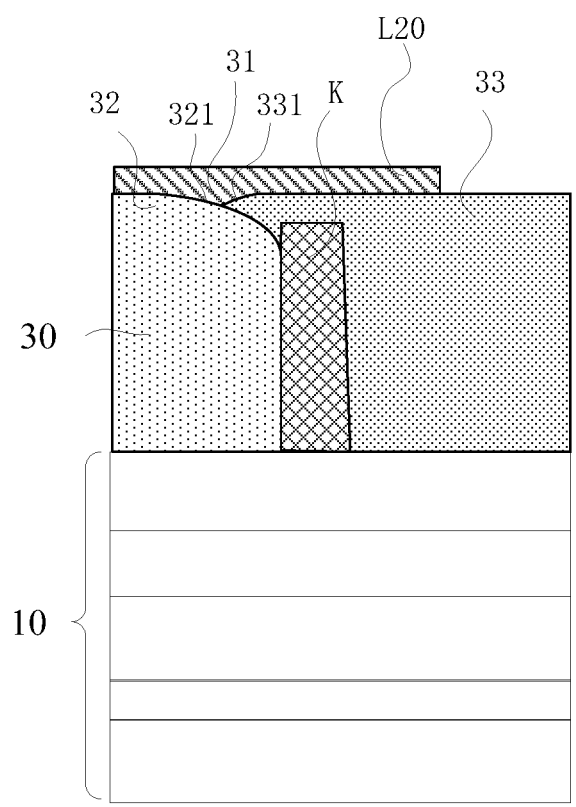
FIG. 13 illustrates a sectional view of the display panel in FIG. 11 along a Z-Z' direction.

Another embodiment of the present disclosure provides another display panel. As shown in FIG. 11 illustrating a locally plan view of the display panel in the present embodiment, FIG. 12 which is a cross-sectional view of the display panel in FIG. 11 along Y-Y', and FIG. 13 which is a cross-sectional view of the display panel in FIG. 11 along Z-Z', the display panel may further include a barrier wall K. Edges of the film layer of the first encapsulation layer 32 may be cut off on sides of the barrier wall K away from the hole area FA. The second encapsulation layer 33 may cover the barrier wall K and the edges of the film layer of the first encapsulation layer 32. Correspondingly. the groove 31 may be located between the barrier wall K and the display area AA, and the barrier wall K may be located between the groove 31 and the light transmission area FA.

Figure 14:
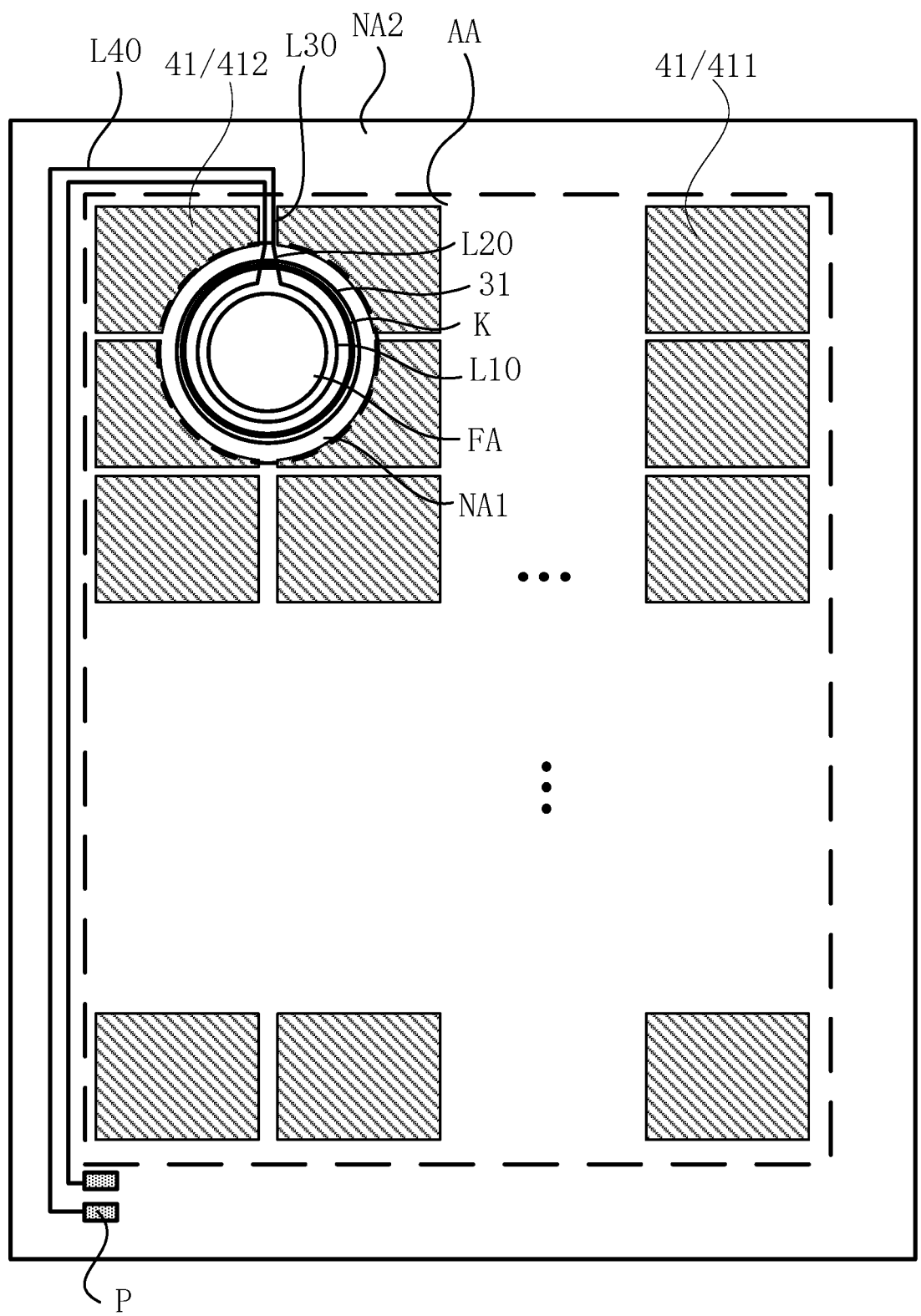
FIG. 14 illustrates a schematic plan view of another exemplary display panel consistent with various disclosed embodiments in the present disclosure.

Another embodiment of the present disclosure provides another display panel. As shown in FIG. 14 illustrating a plan view of the display panel in the present embodiment, FIG. 15 which is a locally plan view of the display panel in FIG. 14, and FIG. 16 which is a cross-sectional view of the display panel in FIG. 15 along G-G', the display panel may further include a touch-control layer 40. The crack detection line L10 and the first connection lines L20 may both be disposed in the touch-control layer 40, which may be beneficial to reduce the thickness of the display panel. For description purposes only, the embodiments in FIGS. 14-16 where the crack detection line L10 and the first connection lines L20 are disposed in the touch-control layer 40 are used as examples to illustrate the present disclosure, and do not limit the scope of the present disclosure. In some other embodiments, the crack detection line L10 and the first connection lines L20 may both be disposed in other conducting film layers.

Figure 15:
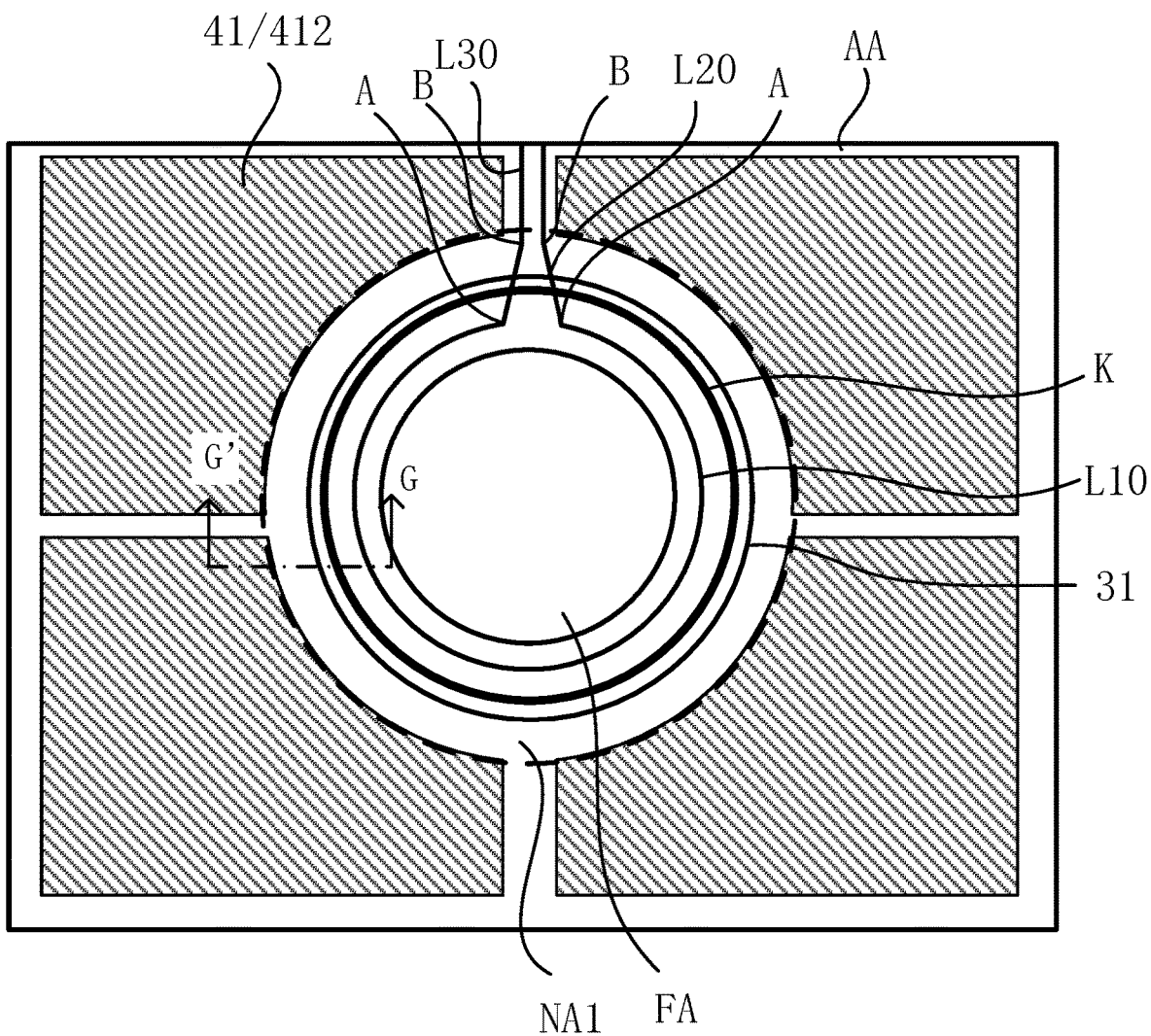
FIG. 15 illustrates a partial plan view of the display panel in FIG. 14.
Figure 16:
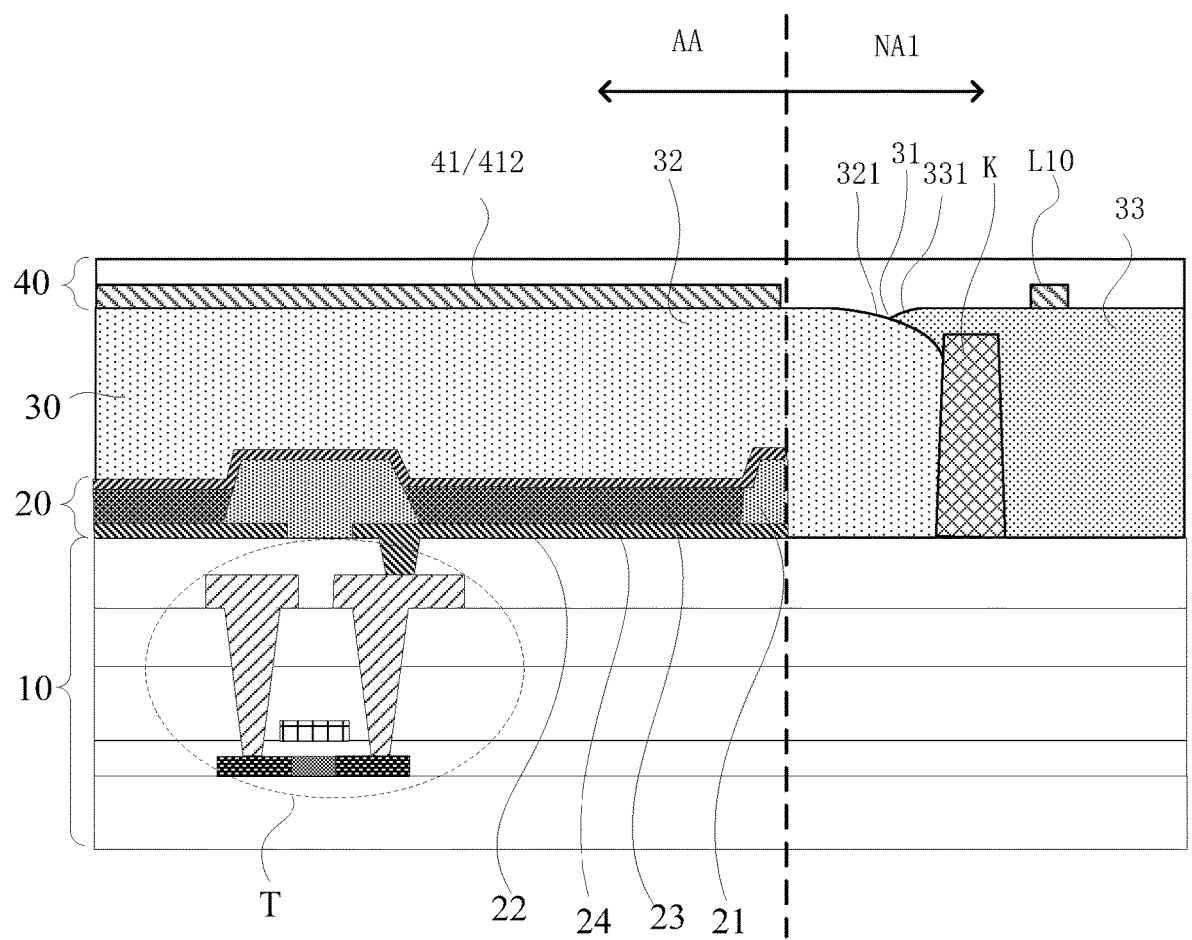
FIG. 16 illustrates a sectional view of the display panel in FIG. 11 along a G-G' direction.

As shown in FIGS. 14-16, in some embodiments, the touch-control layer 40 may include a plurality of touch-control electrodes 41, and the plurality of touch-control electrodes 41 may be located in the display area AA. Since the display panel includes the light transmission area FA and the first frame area NA1 surrounding the light transmission area FA, the plurality of touch-control electrodes 41 may include regular touch-control electrodes 411 and irregularly-shaped touch-control electrodes 412. The shapes of the regular touch-control electrodes 411 may be different from the shapes of the irregularly-shaped touch-control electrodes 412. Among them, the irregularly-shaped touch-control electrodes 412 may be adjacent to the first frame area NA1 and have edges adjacent to the first frame area NA1 matching the structure of the first frame area NA1.

In some embodiments, the touch-control layer 40 may be located on a side of the encapsulation layer 30 away from the light-emitting layer 20, and may use the encapsulation layer 30 as a carrier substrate and be directly fabricated on the encapsulation layer 30. Therefore, there may be no need to additionally fabricate the touch-control panel which needs be subsequently bonded to the display panel part. That is, the touch-control layer 40 may be integrated in the display panel.

The above embodiment may use a self-capacitance touch-control mode in the display panel and the plurality of the touch-control electrodes may form a mesh structure. The embodiment is used as an example to illustrate the present disclosure and does not limit the scopes of the present disclosure. In some other embodiments, the display panel may also adopt a mutual capacitive touch-control mode. In this case, each touch-control electrode may include a touch-control sensing electrode and a touch-control driving electrode. The touch-control sensing electrode and touch-control driving electrode may be arranged in two metal layers respectively. In other embodiment, the touch-control sensing electrode and the touch-control driving electrode can also be arranged on the same metal layer and have a mesh structure, and the corresponding connection may be achieved through a metal bridge. The present disclosure has no limit on this. The plurality of touch-control electrodes 41 may be made of a thin-film conductive material or a metal material. The present disclosure has no limit on the specific structure and material of the plurality of touch-control electrodes 41.

Figure 17:
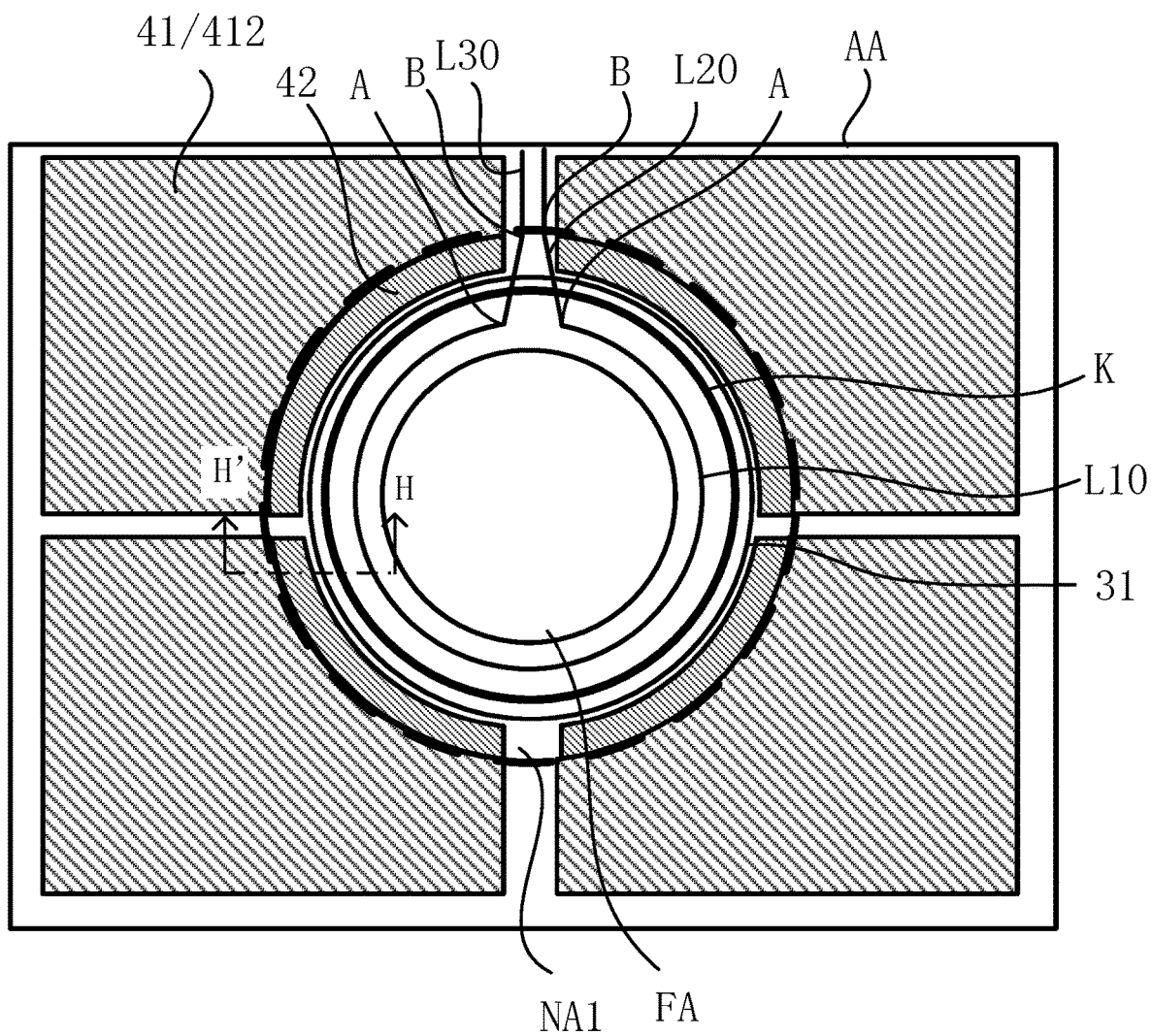
FIG. 17 illustrates a partial plan view of another exemplary display panel consistent with various disclosed embodiments in the present disclosure.
Figure 18:
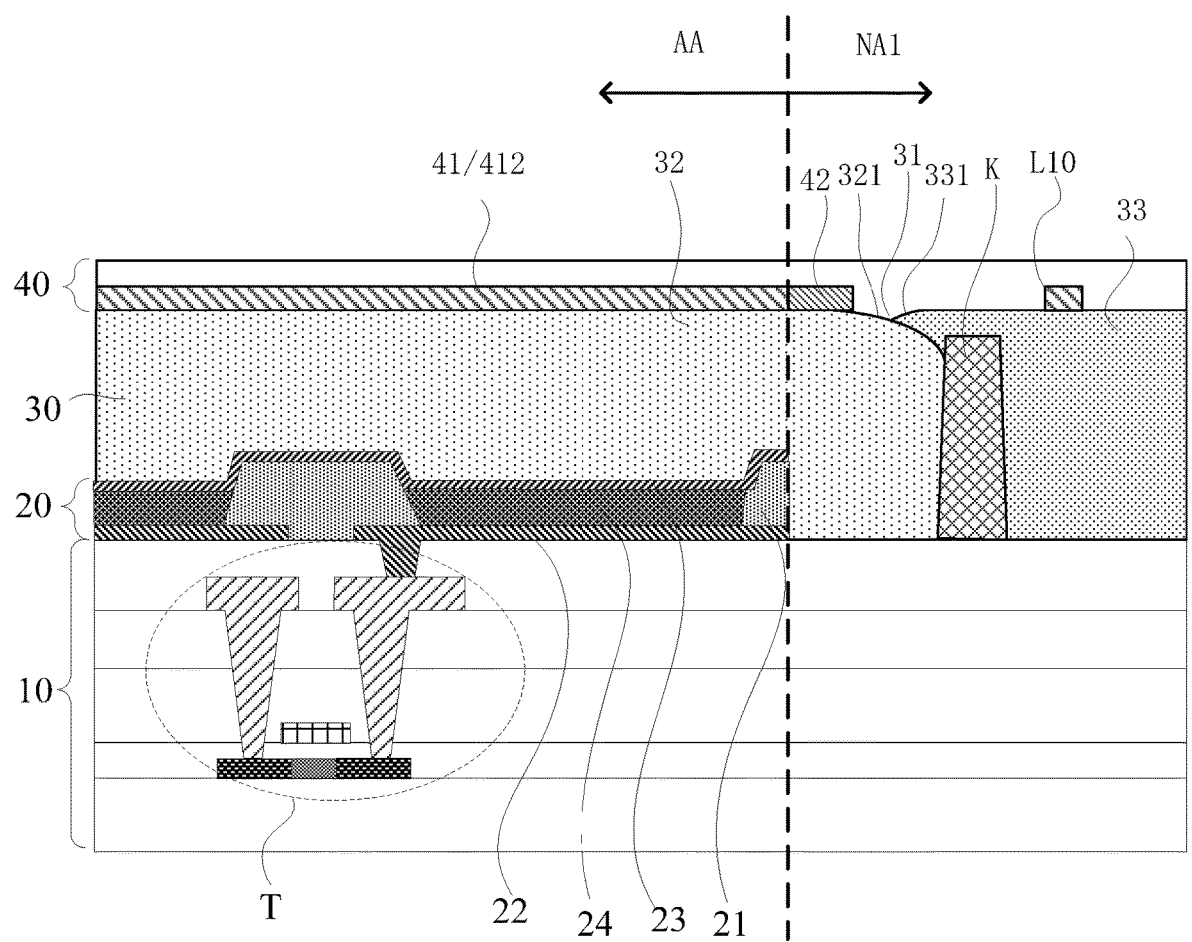
FIG. 18 illustrates a sectional view of the display panel in FIG. 17 along an H-H' direction.

Another embodiment of the present disclosure provides another display panel. As shown in FIG. 17 which is a locally plan view of the display panel in the present embodiment, and FIG. 18 which is a cross-sectional view of the display panel in FIG. 17 along H-H', the touch-control layer 40 may further include compensation structures 42 which may be located between the crack detection line L10 and the display area AA. When the area of one irregularly-shaped touch-control electrode 412 is smaller than that of one corresponding regular touch-control electrode, the irregularly-shaped touch-control electrode 412 may be electrically connected to at least one compensation structure 42 which is made of conductive material, and the signal on the at least one compensation structure 42 may be same as the signal on the irregularly-shaped touch-control electrode electrically connected the at least one compensation structure. In the touch-control detection stage, the compensation structures 42 can also form a capacitance with the finger or the ground, thereby compensating the capacitance formed by the irregularly-shaped touch-control electrode 412 and the finger or the ground. Correspondingly, a difference in capacitance formed by the irregularly-shaped touch-control electrode 412 and the regular touch-control electrode cause during touch-control detection due to the difference in the areas may be reduced, thereby improving the accuracy of touch-control detection. Optionally, the compensation structures 42 may have a whole surface shape and may be arranged in the same layer as the touch-control electrode 41. Optionally, the compensation structures 42 may be made of the same material as the irregularly-shaped touch-control electrodes 412 electrically connected to the compensation structures 42. The compensation structures 42 and the irregularly-shaped touch-control electrodes 412 electrically connected to the compensation structures 42 can be manufactured through the same process.

Figure 19:
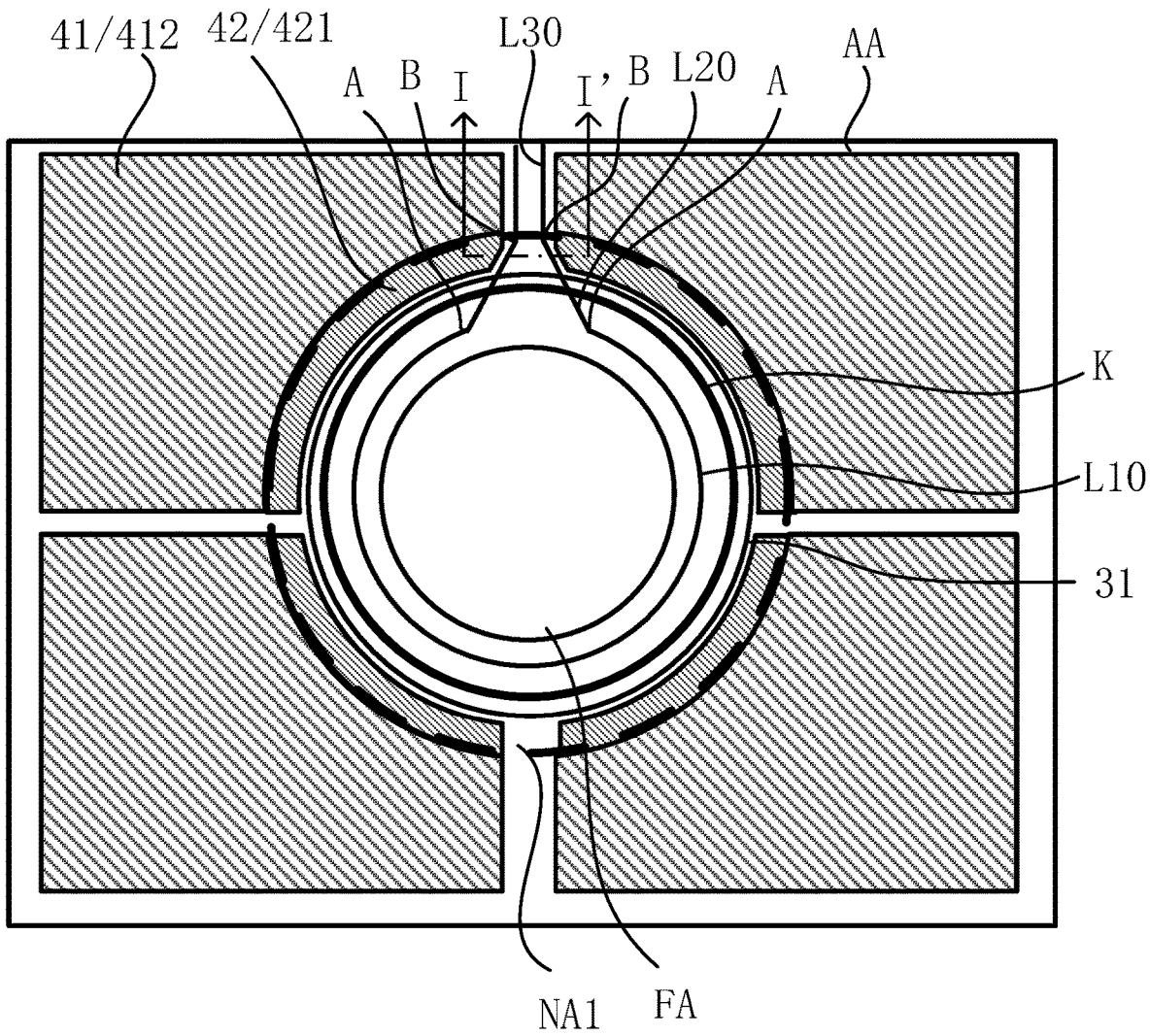
FIG. 19 illustrates a partial plan view of another exemplary display panel consistent with various disclosed embodiments in the present disclosure.
Figure 20:
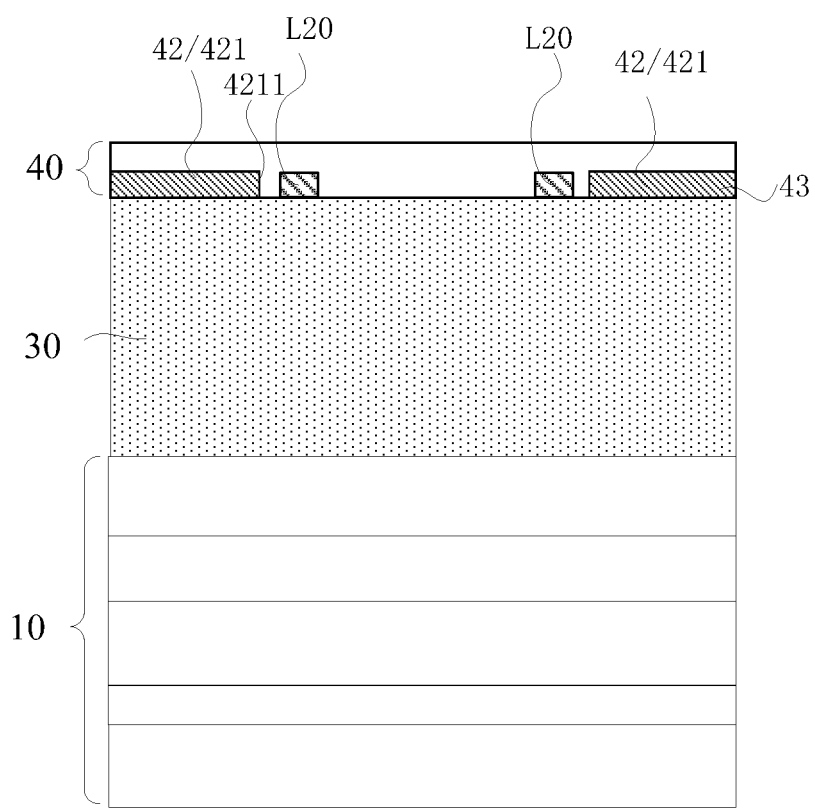
FIG. 20 illustrates a sectional view of the display panel in FIG. 19 along an I-I' direction.

Another embodiment of the present disclosure provides another display panel. As shown in FIG. 19 which is a locally plan view of the display panel in the present embodiment, and FIG. 20 which is a cross-sectional view of the display panel in FIG. 19 along I-I', the touch-control layer 40 may include a first metal layer 43. The plurality of touch-control electrodes 41 and the compensation structures 42 may be disposed in the first metal layer 43. The crack detection line L10 and the first connection lines L20 may be also located in the first metal layer 43. In the direction perpendicular to the display panel, the first connection lines L20 and the compensation structures 42 may not overlap, to prevent the arrangement of the first connection lines L20 and the arrangement of the compensation structures 42 from influencing each other.

Specifically, along the circumferential direction of the light transmission area FA, a portion of the compensation structures 42 adjacent to the first connecting lines L20 may be first compensation structures 421. Each first compensation structure 421 may include a sub-edge 4211. Along the circumferential direction of the light transmission area FA, the sub-edge 4211 may be located on a side of the first compensation structure 421 close to the first connecting lines L20. Along the circumferential direction of the aperture area FA, the distance between one sub-edge 4211 and the first connecting lines L20 that are close to it may be larger than 0, such that the first connecting lines L20 and the compensation structures 42 do not overlap along the position perpendicular to the display panel.

Figure 21:
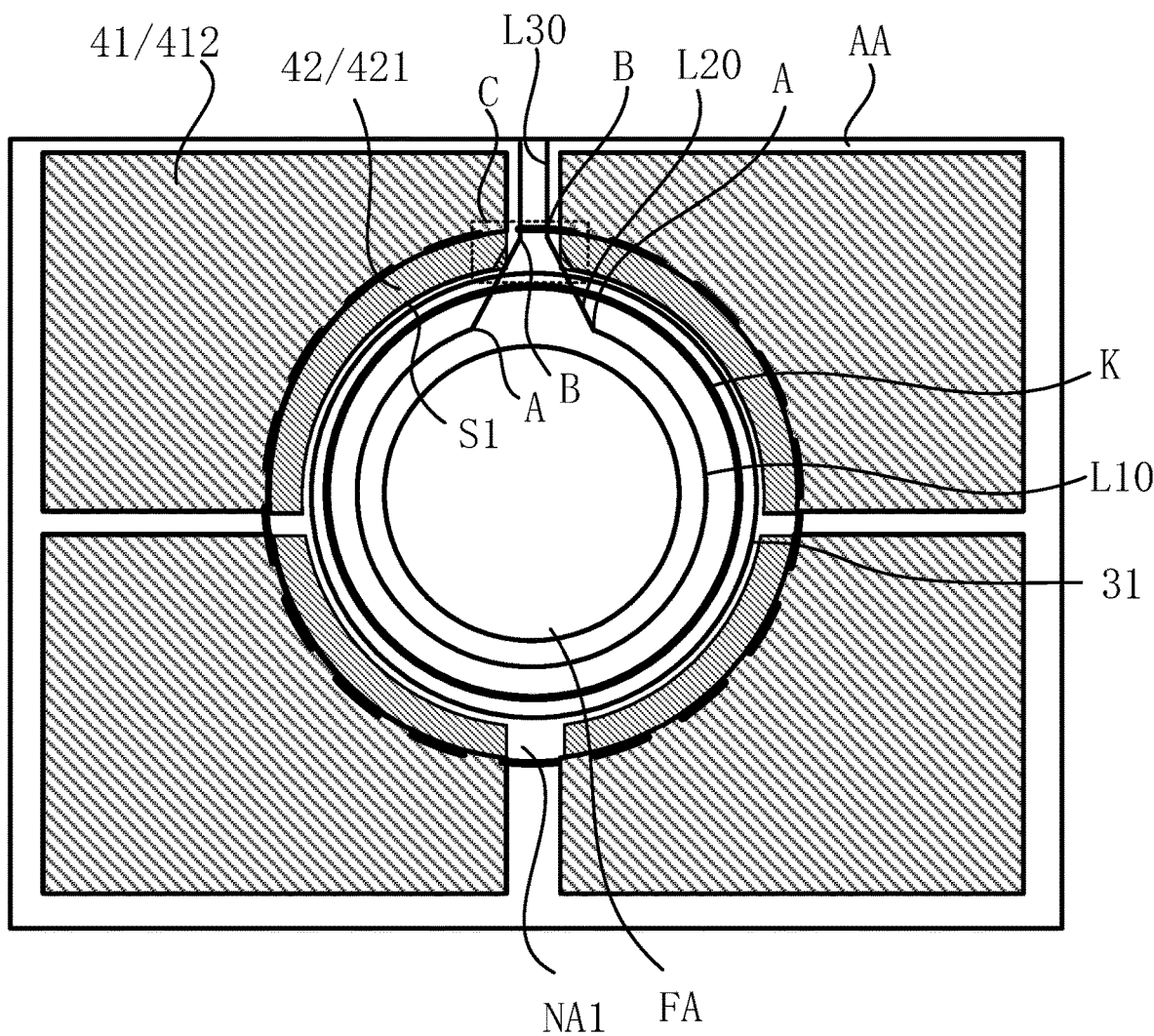
FIG. 21 illustrates a partial plan view of another exemplary display panel consistent with various disclosed embodiments in the present disclosure.
Figure 22:
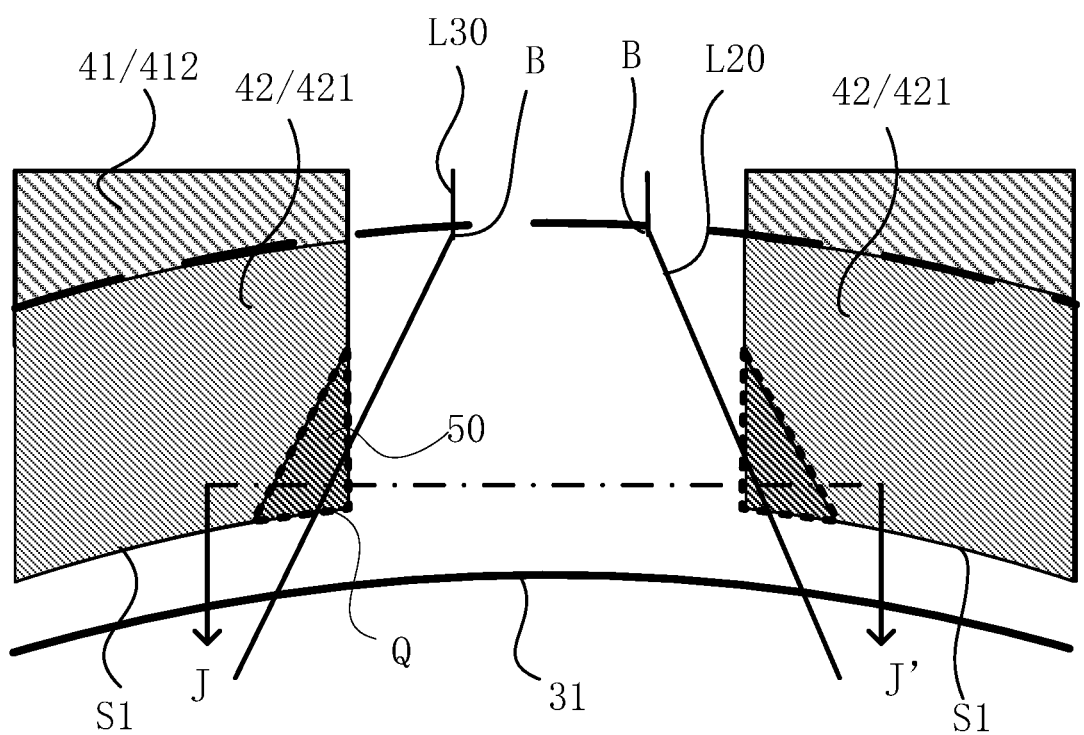
FIG. 22 illustrates an enlarged view of section C of the display panel in FIG. 21.
Figure 23:
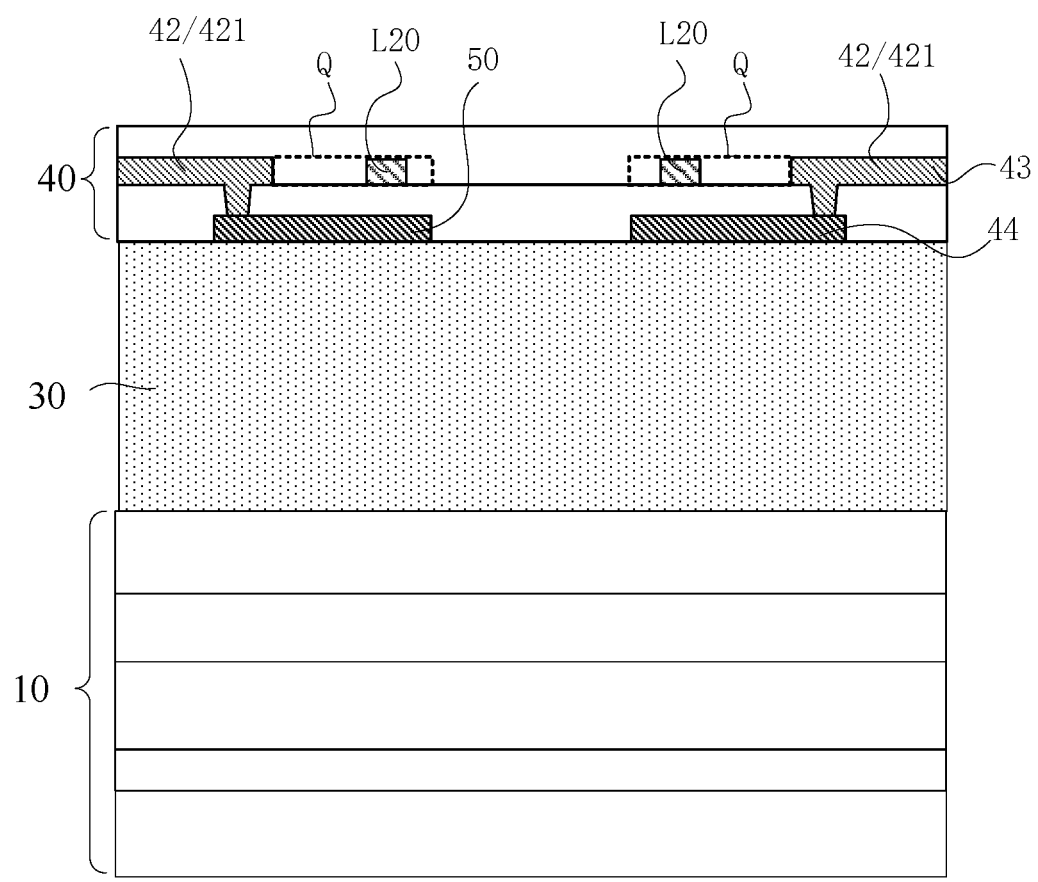
FIG. 23 illustrates a sectional view of the display panel in FIG. 22 along a J-J' direction.

Another embodiment of the present disclosure provides another display panel. As shown in FIG. 21 which is a locally plan view of the display panel in the present embodiment, FIG. 22 which is an enlarged view of section C of the display panel in FIG. 21, and FIG. 23 which is a cross-sectional view of the display panel in FIG. 22 along J-J', the display panel may further include a second metal layer 44. The first metal layer 43 and the second metal layer 44 may be mutually insulated metal layers. Optionally, in some embodiments, the second metal layer 44 can be located on a side of the first metal layer 43 close to the base substrate 10. In some other embodiments, the second metal layer 44 can also be located on a side of the first metal layer 43 away from the base substrate 10.

Along the circumferential direction of the light transmission area FA, a portion of the compensation structures 42 adjacent to the first connecting lines L20 may be first compensation structures 421.

Each first compensation structure 421 may include a first edge S1. Along the direction from the display area AA to the light transmission area FA, the first edge S1 may be located on a side of the first compensation structure 421 close to the light transmission area FA.

The first metal layer 43 may include a missing area Q. The missing area Q may be located in the first frame area NA1 along the extension direction of the first edge S1. The missing area Q may be located on a side of the first compensation structures 421 close to the first connecting lines L20. The missing area Q may be not provided with the first compensation structures 421, such that the first connecting lines L20 can extend through the missing area Q. The arrangement of the missing area Q can help increase the distance between the two first connecting lines L20.

Further, the design of the present disclosure can not only ensure the effective compensation capability of the compensation structures be consistent with the electrode material as much as possible, but also avoid the problem of visible patterns. Optionally, the display panel may further include a compensating part 50. The compensating part 50 may be located on the second metal layer 44. In the direction perpendicular to the display panel, the compensating part 50 and the missing area Q may at least partially overlap, which effectively prevents patterns in the missing area Q from being visible caused by the absence of the first compensation structure 421 in the missing region Q. The visual effect may be improved.

Further, the compensation part 50 may partially overlap the first connecting lines L20, which effectively prevents the pattern of the first connecting line L20 from being visible due to the absence of the first compensation structure 421 in the missing region Q. The visual effect may be improved.

Optionally, because the compensation structures 42 may be made of a metal material and have light-reflecting characteristics, the arrangement of the compensation part 50 can avoid the problem that the first compensation structures 421 or the pattern of the missing area Q is visible.

The compensation part 50 may be electrically connected to the first compensation structures 421, and the signal on the compensation part 50 may be the same as the signal on the first compensation structures 421 that is electrically connected to it. The compensation part 50 can perform capacitance compensation on the first compensation structures 421, thereby reducing the difference in capacitance formed by the first compensation structures 421 and other compensation structures 42 during touch-control detection due to the absence of the first compensation structures 421 in the missing region Q. The accuracy of touch-control detection may be improved. Optionally, the compensation part 50 may be electrically connected to the first compensation structures 421 through a via hole.

Figure 24:
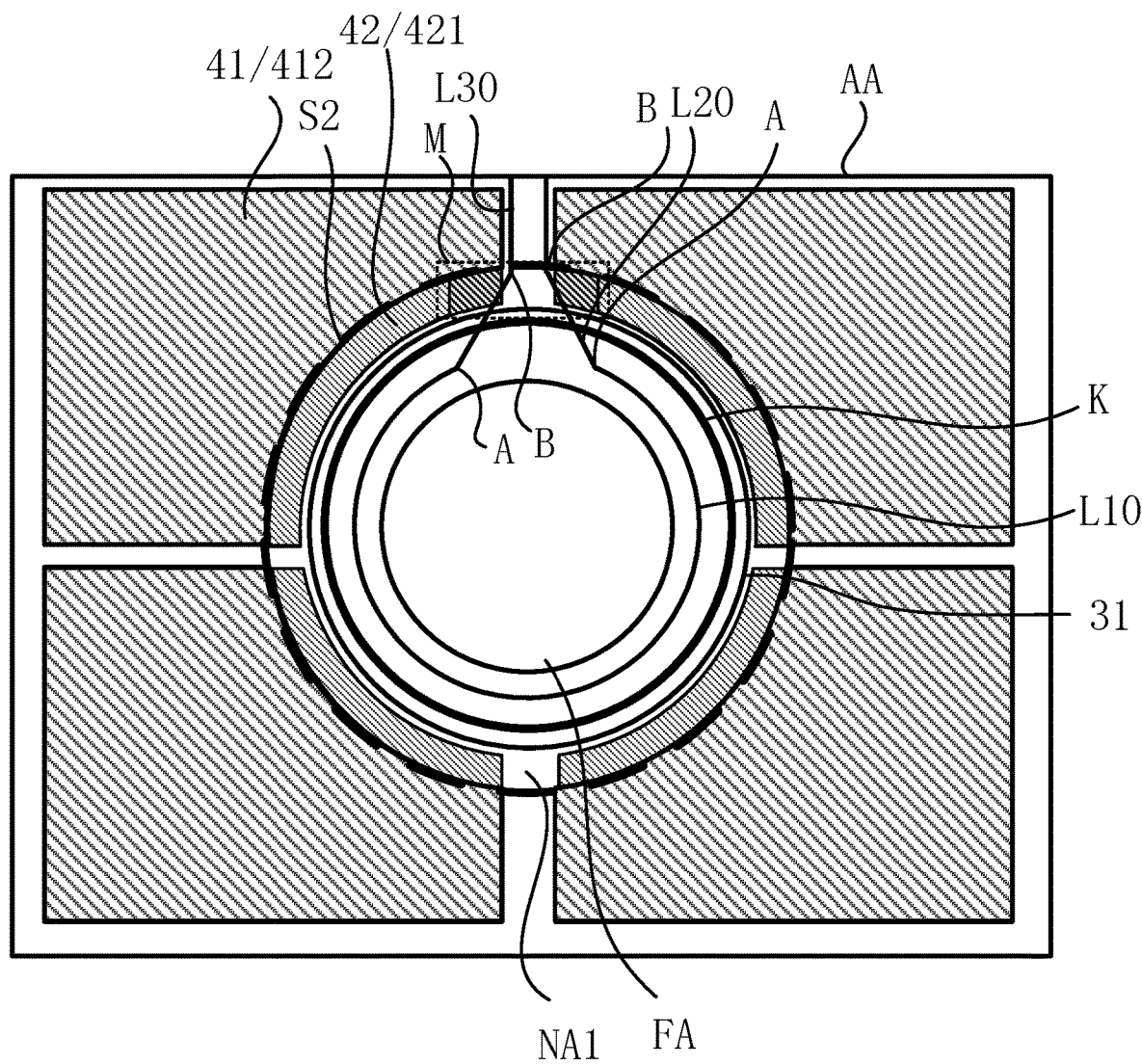
FIG. 24 illustrates a partial plan view of another exemplary display panel consistent with various disclosed embodiments in the present disclosure.
Figure 25:
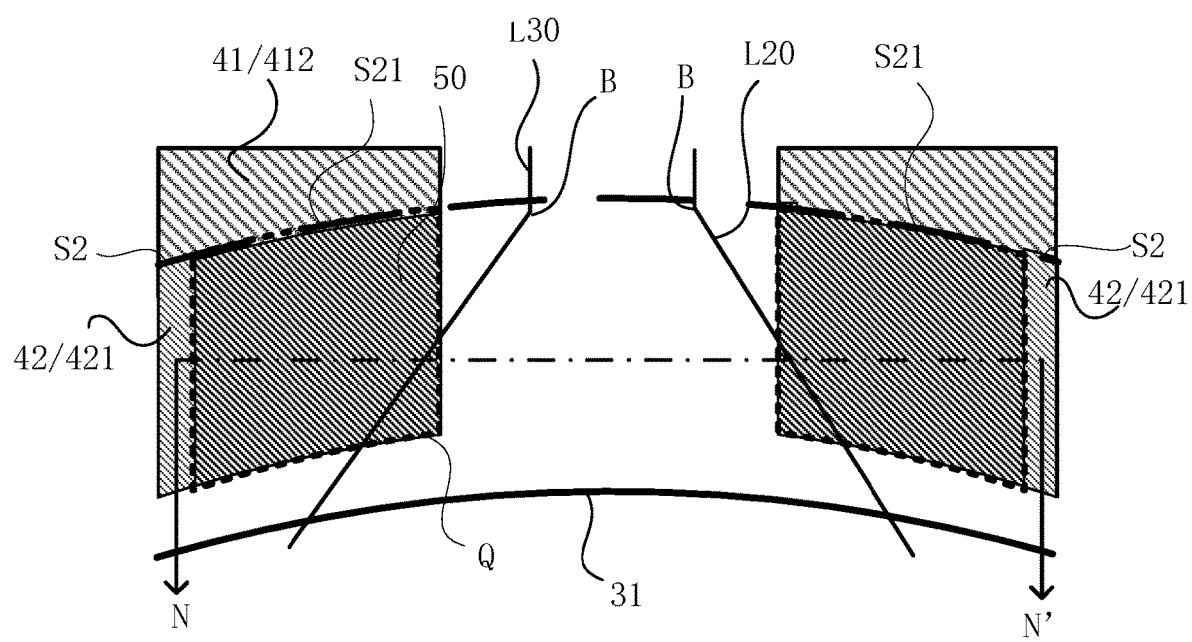
FIG. 25 illustrates an enlarged view of section M of the display panel in FIG. 24.
Figure 26:
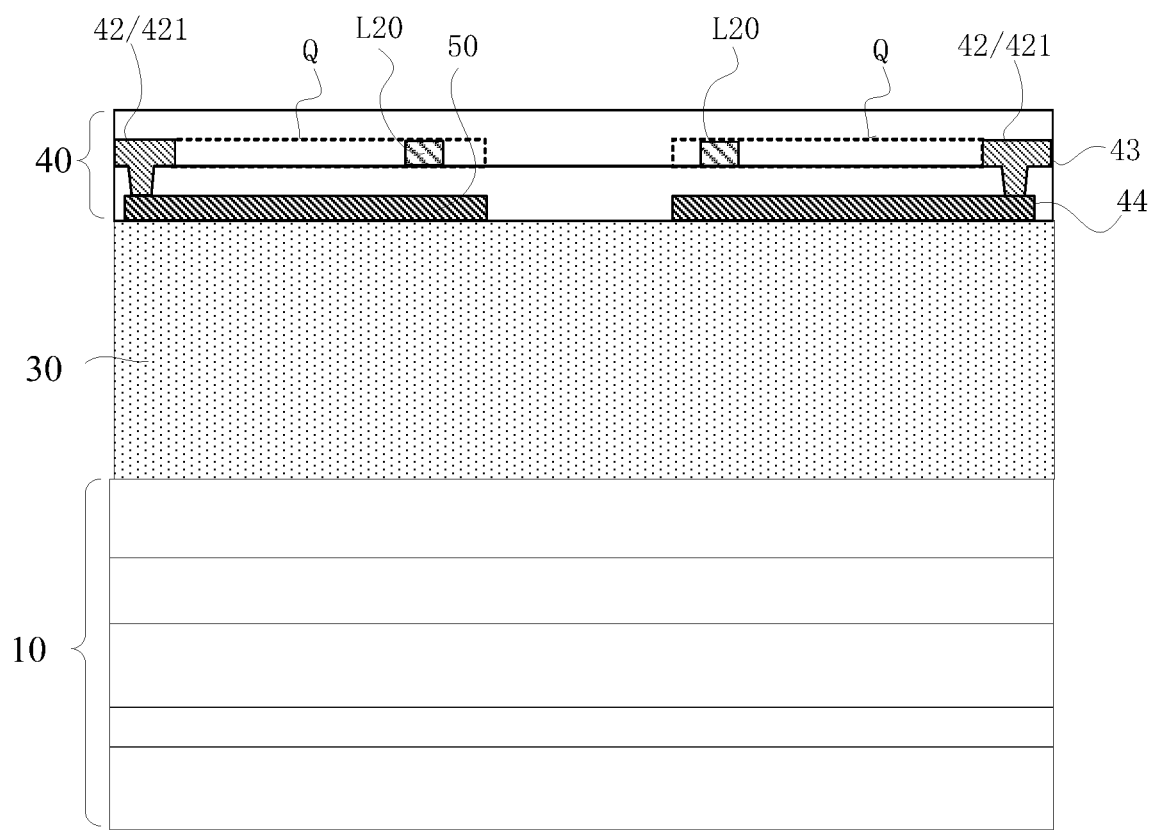
FIG. 26 illustrates a sectional view of the display panel in FIG. 25 along an N-N' direction.

Another embodiment of the present disclosure provides another display panel. As shown in FIG. 24 which is a locally plan view of the display panel in the present embodiment, FIG. 25 which is an enlarged view of section M of the display panel in FIG. 24, and FIG. 26 which is a cross-sectional view of the display panel in FIG. 25 along N-N', the display panel may further include a second metal layer 44. The first metal layer 43 and the second metal layer 44 may be mutually insulated metal layers. Optionally, in some embodiments, the second metal layer 44 can be located on a side of the first metal layer 43 close to the base substrate 10. In some other embodiments, the second metal layer 44 can also be located on a side of the first metal layer 43 away from the base substrate 10.

Along the circumferential direction of the light transmission area FA, a portion of the compensation structures 42 adjacent to the first connecting lines L20 may be first compensation structures 421.

Each irregularly-shaped touch-control electrode 412 may include a second edge S2 adjacent to the first frame area NA1. One first compensation structure 421 may be electrically connected to one corresponding irregularly-shaped touch-control electrode 412 through one corresponding second edge S2. Each first compensation structure 421 may extend along one corresponding second edge S2. An area adjacent to at least a first segment S21 of one second edge S2 of at least one irregularly-shaped touch-control electrode 412 may form the missing area Q. The missing area Q may be not provided with the first compensation structures 421, such that the first connecting lines L20 can extend through the missing area Q. The arrangement of the missing area Q can help increase the distance between the two first connecting lines L20.

Further, the design of the present disclosure can not only ensure the effective compensation capability of the compensation structures be consistent with the electrode material as much as possible, but also avoid the problem of visible patterns. Optionally, the display panel may further include a compensating part 50. The compensating part 50 may be located on the second metal layer 44. In the direction perpendicular to the display panel, the compensating part 50 and the missing area Q may at least partially overlap, which effectively prevents patterns in the missing area Q from being visible caused by the absence of the first compensation structure 421 in the missing region Q. The visual effect may be improved.

Further, the compensation part 50 may partially overlap the first connecting lines L20, which effectively prevents the pattern of the first connecting line L20 from being visible due to the absence of the first compensation structure 421 in the missing region Q. The visual effect may be improved.

Optionally, because the compensation structures 42 may be made of a metal material and have light-reflecting characteristics, the arrangement of the compensation part 50 can avoid the problem that the first compensation structures 421 or the pattern of the missing area Q is visible.

The compensation part 50 may be electrically connected to the first compensation structures 421, and the signal on the compensation part 50 may be the same as the signal on the first compensation structures 421 that is electrically connected to it. The compensation part 50 can perform capacitance compensation on the first compensation structures 421, thereby reducing the difference in capacitance formed by the first compensation structures 421 and other compensation structures 42 during touch-control detection due to the absence of the first compensation structures 421 in the missing region Q. The accuracy of touch-control detection may be improved. Optionally, the compensation part 50 may be electrically connected to the first compensation structures 421 through a via hole.

In some other embodiments, the missing area Q may be configured to another shape according to a wiring structure of the first connection lines L20 in the actual production process.

As shown in FIGS. 21 to 24, in some embodiments, a total vertical projection pattern of the first compensation structures 421 and the compensation part 50 electrically connected to the first compensation structures 421 on the display panel may be a fan ring. Further, the total vertical projection pattern of the first compensation structures 421 and the compensation part 50 electrically connected to the first compensation structures 421 on the display panel may tend to be the same as the vertical projection pattern of other compensation structures 42 on the display panel, and the capacitance formed by the first compensation structures 421 and the compensation part 50 electrically connected to it during touch-control detection tends to be the same as the capacitance formed by other compensation structures 42 during touch-control detection, to further improve the accuracy of touch-control detection.

Figure 27:
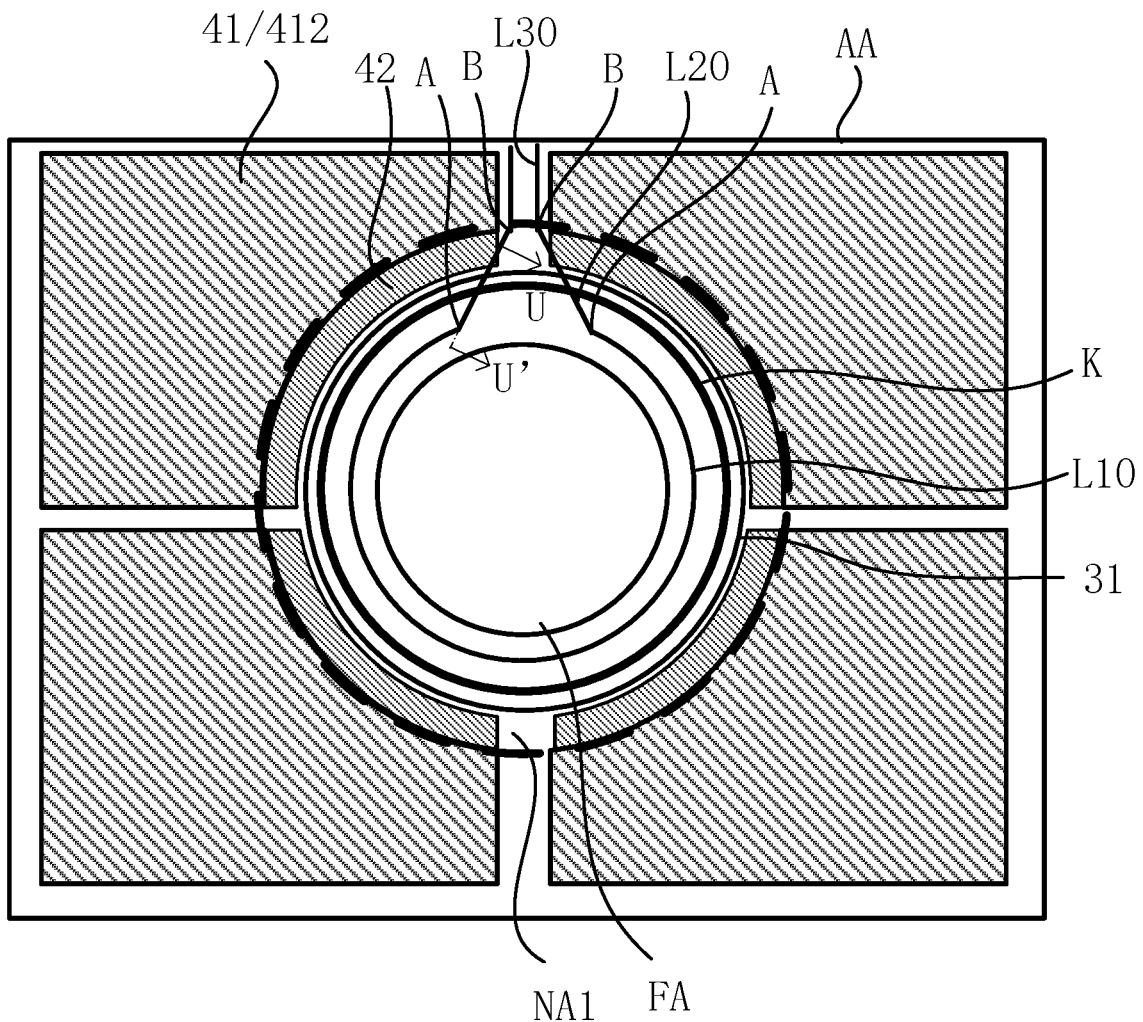
FIG. 27 illustrates a partial plan view of another exemplary display panel consistent with various disclosed embodiments in the present disclosure.
Figure 28:
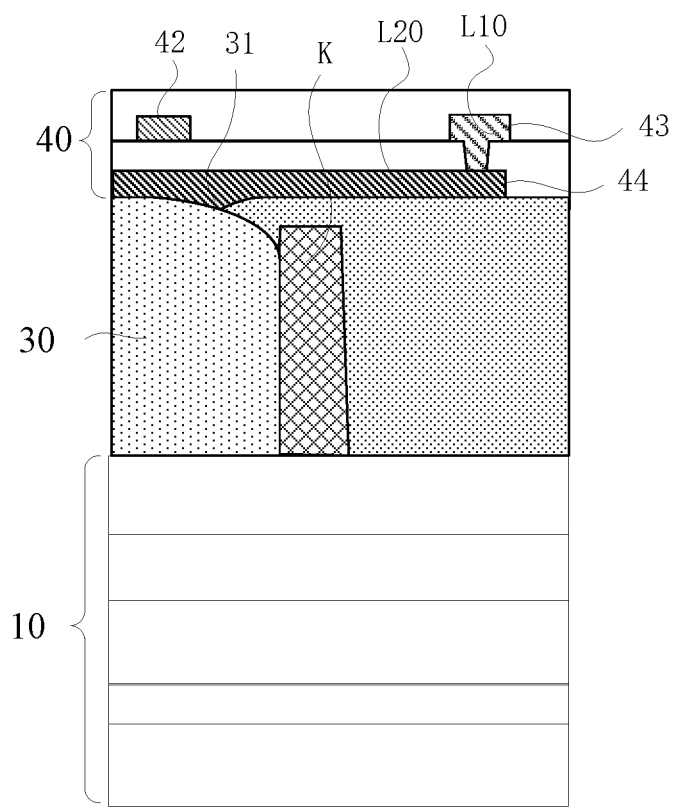
FIG. 28 illustrates a sectional view of the display panel in FIG. 27 along a U-U' direction.

Another embodiment of the present disclosure provides another display panel. As shown in FIG. 27 which is a locally plan view of the display panel in the present embodiment and FIG. 28 which is a cross-sectional view of the display panel in FIG. 27 along U-U', the touch-control layer may include a first metal layer 43 and a second metal layer 44. The first metal layer 43 and the second metal layer 44 may be mutually insulated metal layers. Optionally, in some embodiments, the second metal layer 44 can be located on a side of the first metal layer 43 close to the base substrate 10. In some other embodiments, the second metal layer 44 can also be located on a side of the first metal layer 43 away from the base substrate 10.

The plurality of touch-control electrodes 41, the compensation structures 42 and the crack detection line L10 may be located in the first metal layer 43. The first connection lines L20 may be located in the second metal layer 44. The first connection lines L20 and the crack detection line L10 may be electrically connected via a through hole. Since the first connection lines L20 and the compensation structures 42 may be respectively located in different metal layers, in the direction perpendicular to the display panel, the first connecting lines L20 can partially overlap the compensation structures 42, which is beneficial to increase the distance between the two first connecting lines L20.

Figure 29:
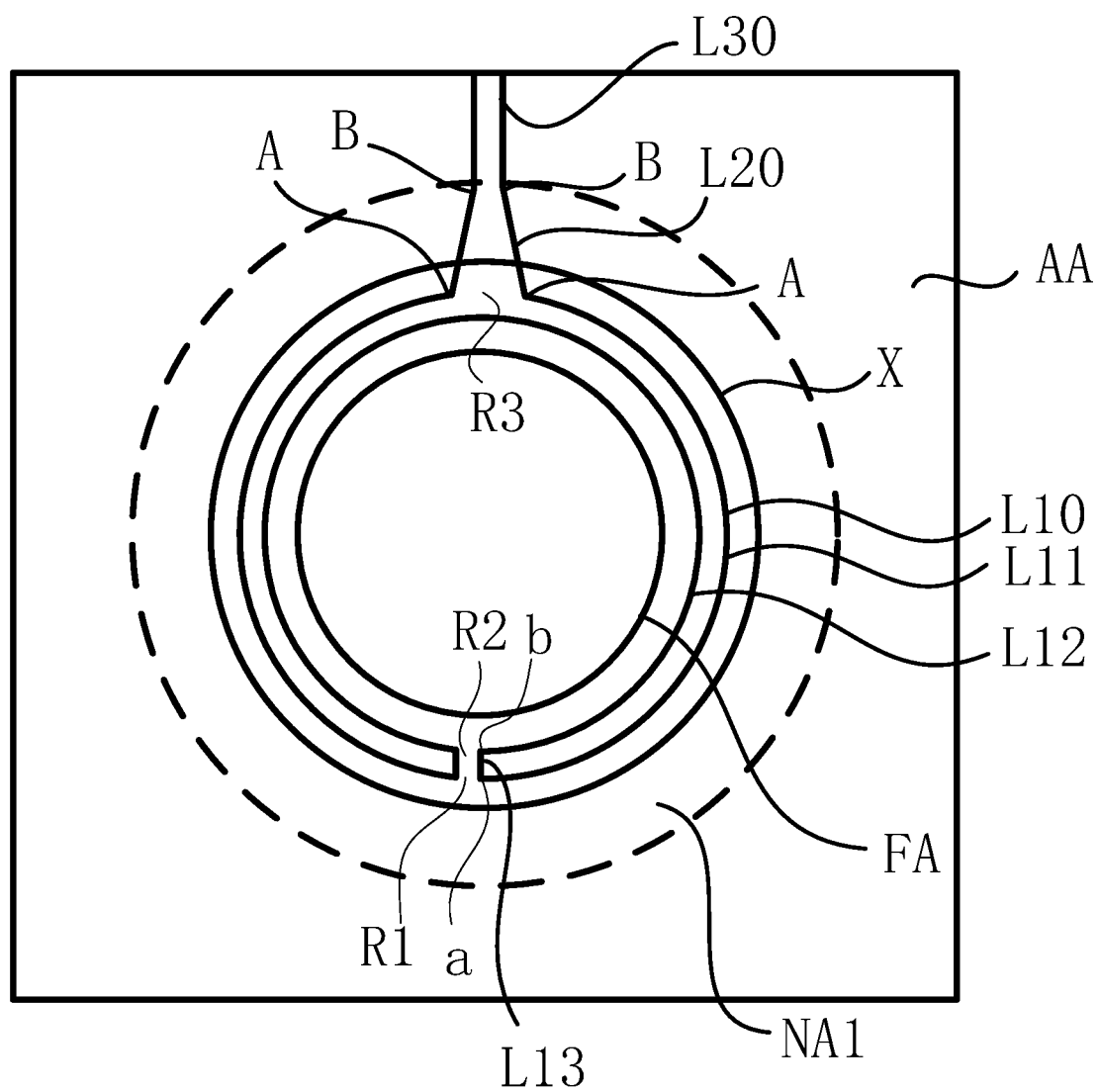
FIG. 29 illustrates a partial plan view of another exemplary display panel consistent with various disclosed embodiments in the present disclosure.

Another embodiment of the present disclosure also provides another display panel. As shown in FIG. 29 which is a local plan view of the display panel in the present embodiment, the crack detection line L10 may include a first winding portion L11, a second winding portion L12, and first connection portions L13.

The first winding portion L11 may extend in the circumferential direction of the light transmission area FA, and the first winding portion L11 may be provided with a first gap R1, and the second winding portion L12 may be located between the first winding portion L11 and the light transmission area FA. Further, the second winding portion L12 may extend in the circumferential direction of the light transmission area FA, and the first winding portion L11 may surround the second winding portion L12. The second winding portion L12 may be provided with a second gap R2, and the first gap R1 and the second gap R2 may be adjacent. That is, the first gap R1 and the second gap R2 may be arranged in a direction from the light transmission area FA to the display area AA.

The first winding portion L11 may include two third ends a forming the first gap R1. The second winding portion L12 may include two fourth ends forming the second gap R2. The third ends a and the fourth ends b may have a one-to-one correspondence. Each third end a may be connected to a corresponding fourth end b through a first connection portion L13, such that the crack detection line L10 has a completed structure.

The two ends of the crack detection line L10 may form a third gap R3 on the second winding portion L12, and the third gap R3 may be not adjacent to the second gap R2. That is, the third gap R3 and the second gap R2 may be arranged staggered, such that a portion of the second winding portion L12 may be adjacent to the third gap R3. Since the resistance value change of the crack detection line L10 can be detected to detect whether the crack detection line L10 has a disconnection phenomenon, and then whether there is a crack extending to the display area AA at the edge of the light transmission area FA can be determined to realize the crack detection. The two ends of the crack detection line L10 may be connected to the first ends A of the first connecting lines L20, and the distance between the two first ends A may be relatively large, that is, the distance between the two ends of the crack detection line L10 may be relatively large. Correspondingly, the area at the edge of the light transmission area FA corresponding to the third gap R3 may be relatively large. Since a portion of the second winding portion L12 is adjacent to the third gap R3, the crack detection can be realized in the area at the edge of the light transmission area FA corresponding to the third gap R3, effectively solving the problem that the area at the edge of the light transmission area FA corresponding to the third gap R3 cannot be detected. The crack detection range may be increased and the accuracy of the crack detection results may be improved.

Optionally, the distance between the two third ends a may be smaller than the distance between the two ends of the crack detection line L10. When the distance between the two third ends a is smaller, and absence of the crack detection in the area at the edge of the light transmission area FA corresponding to the third gap R3 may have little effect on the accuracy of the crack detection results.

Figure 30:
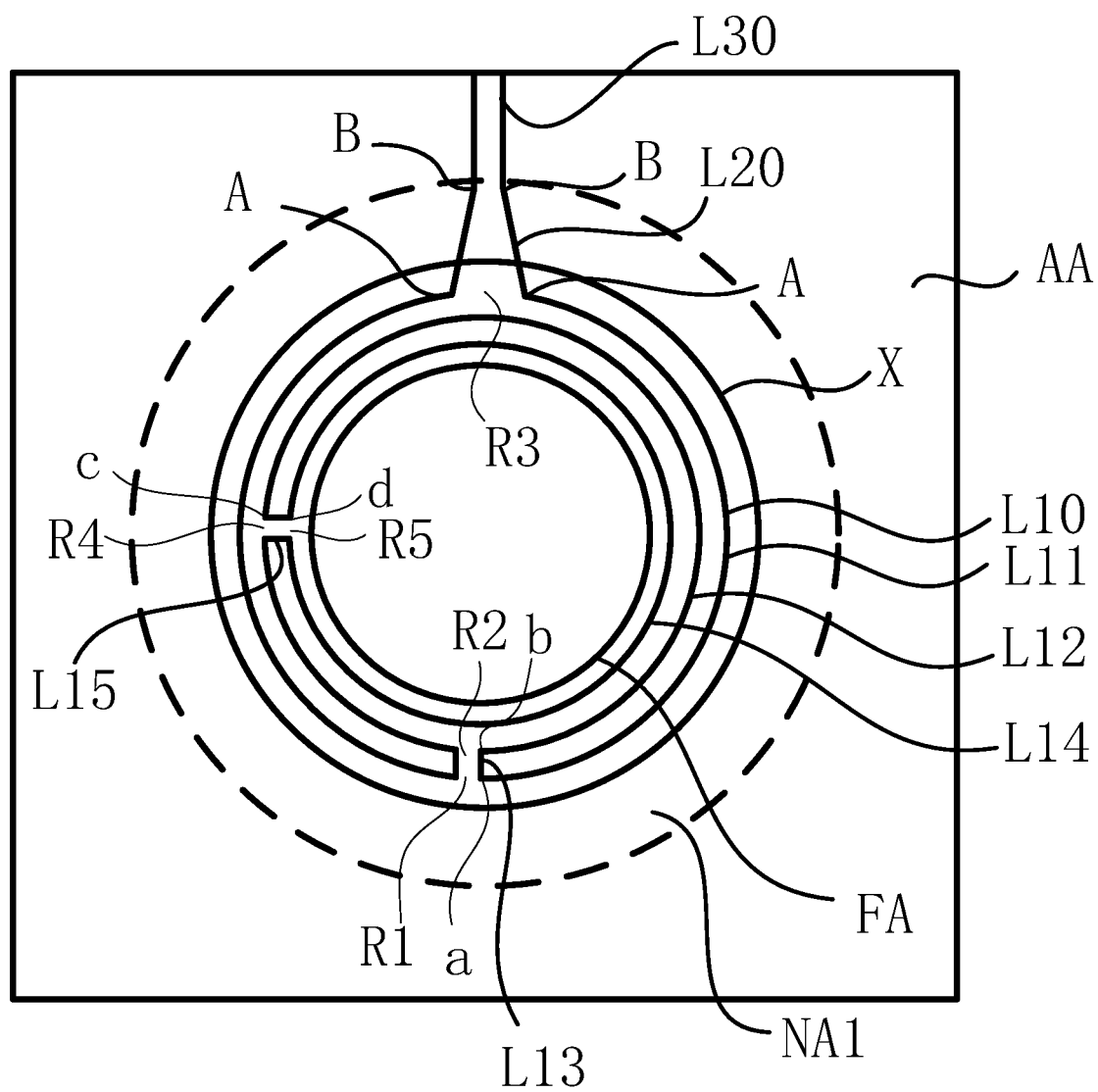
FIG. 30 illustrates a partial plan view of another exemplary display panel consistent with various disclosed embodiments in the present disclosure.

Another embodiment shown in FIG. 30 provides another display panel. As shown in FIG. 30 which is a local plan view of the display panel, the crack detection line L10 may further include a third winding portion L14 and a second connection portion L15.

The second winding portion L12 may be provided with a fourth gap R4. The third winding portion L14 may be located between the second winding portion L12 and the light transmission area FA. The third winding portion L14 may extend in the circumferential direction of the light transmission area FA, and the second winding portion L12 may surround the third winding portion L14. A fifth gap R5 may be disposed in the third winding portion L14. The fourth gap R4 and the fifth gap R5 may be adjacent to each other, that is, the fourth gap R4 and the fifth gap R5 may be arranged in the direction from the light transmission area FA to the display area AA.

The second winding portion L12 may include two fifth ends c forming the fourth gap R4, and the third winding portion L14 may include two sixth ends d forming the fifth gap R5. The fifth ends c and the sixth ends d may have a one-to-one correspondence, and a pair of one fifth end c and one corresponding sixth end d may be connected by the second connecting portion L15, such that the crack detection line L10 can have a complete winding structure.

The fifth gap R5 and the second gap R2 may be not adjacent, that is, the fifth gap R5 and the second gap R2 may be arranged staggered, such that a portion of the third winding portion L14 is adjacent to the second gap R2. The fifth gap R5 and the third gap R3 may be not adjacent, that is, the fifth gap R5 and the third gap R3 may be arranged staggered, such that a portion of the second winding portion L12 is adjacent to the third gap R3. Correspondingly, the crack detection can be realized on an area of the edge of the light transmission area FA corresponding to the second gap R2, the third gap R3, and the fifth gap R5, which effectively solves the problem that the area of the edge of the light transmission area FA corresponding to the second gap R2, the third gap R3, and the fifth gap R5 cannot be detected. Cracks at the edges of the light transmission area FA can be detected in all directions. The crack detection range may be further enlarged and the accuracy of the crack detection results may be improved.

Figure 31:
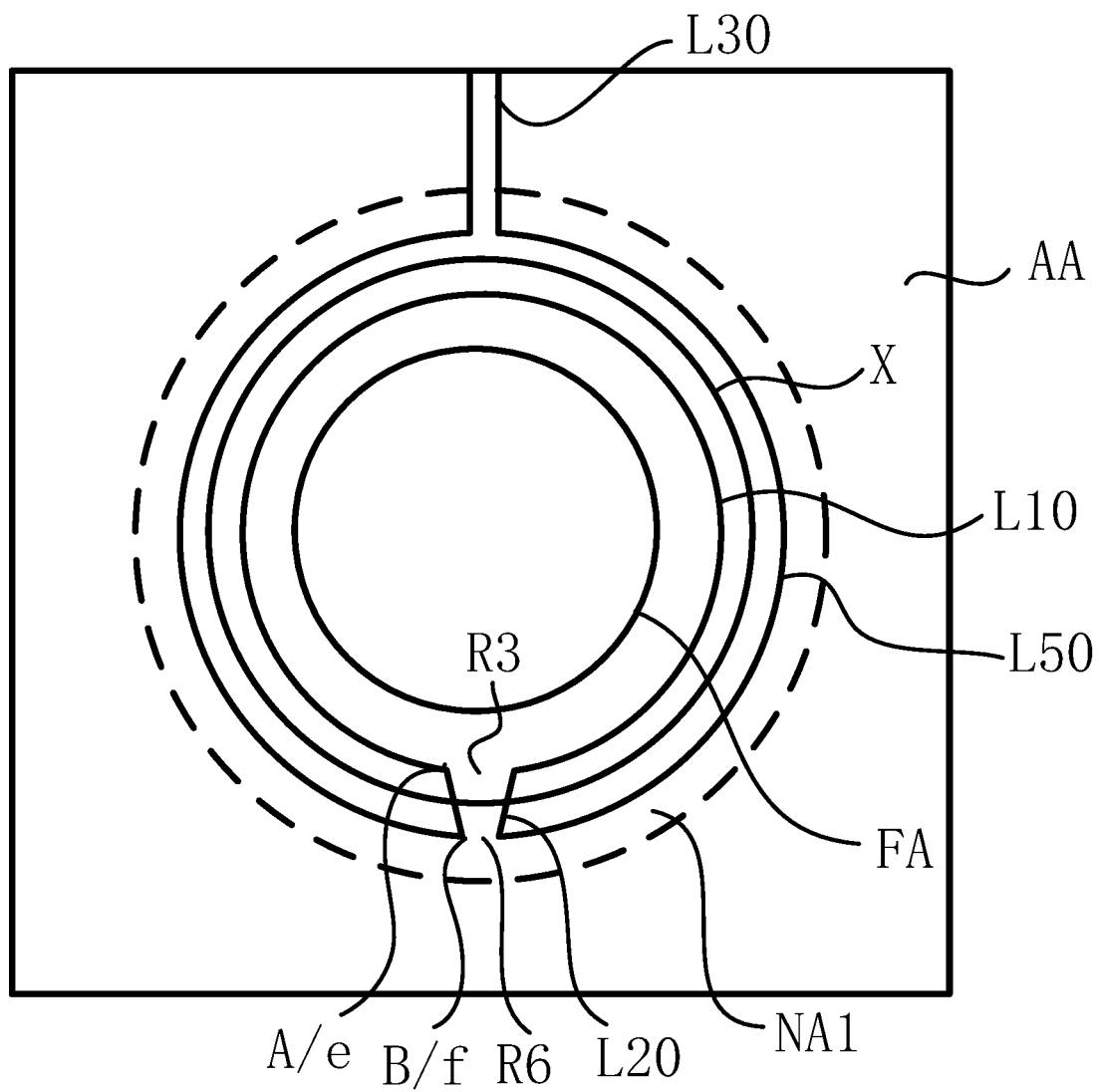
FIG. 31 illustrates a partial plan view of another exemplary display panel consistent with various disclosed embodiments in the present disclosure.

Another embodiment shown in FIG. 31 provides another display panel. As shown in FIG. 31 which is a local plan view of the display panel, the display panel may further include a first detection line L50 surrounding the crack detection line L10. Optionally, the first detection line L50 may surround the step structure X, and the first detection line L50 may be located between the step structure X and the display area AA. Optionally, the step structure X may be one or a combination of grooves, protrusions, or retaining walls.

The crack detection line L10 may extend in the circumferential direction of the light transmission area FA, and both ends of the crack detection line L10 may be seventh ends e. The two seventh ends e may form a third gap R3 on the crack detection line L10. The first detection line L50 may extend in the circumferential direction of the aperture area FA, and a sixth gap R6 may be provided on the first detection line L50. The third gap R3 and the sixth gap R6 may be adjacent, that is, the third gap R3 and the sixth gap R6 may be arranged in a direction pointing to the display area AA from the light transmission area FA. The first detection line L50 may include two eighth ends f forming a sixth gap R6. The seventh ends e and the eighth ends f may be in one-to-one correspondence, and a pair of one seventh end e and one corresponding eighth end f may be connected through one first connecting line L20, therefore realizing the connection between the crack detection line L10 and the first detection line L50.

The crack detection line L10 may be located between the step structure X and the light transmission area FA, and the first detection line L50 may be located between the step structure X and the display area AA. In the direction perpendicular to the display panel, the first connection line L20 and the step structure X may partially overlap, and a short circuit may be likely to occur between the two first connecting lines L20 in the area close to the step structure X. By increasing the distance between the two first connecting lines L20 in the area close to the step structure X, the risk of a short circuit between the two first connecting lines L20 in the area close to the step structure X may be effectively reduced, effectively avoiding the failure of the crack detection function. The first connection line L20 may be connected between the seventh ends e and the eighth ends f, that is, the first connection line L20 may not need to be connected to the second connection line L30. Therefore, the arrangement of the first connection line L20 may not need to consider the subsequent second connection line, which is beneficial to increase the distance between the two first connecting lines L20. The process difficulty may be reduced effectively.

In some embodiments, when the seventh ends e of the crack detection line L10 and the eighth ends f of the first detection line L50 are connected through the first connection lines L20, the implementation and structures in other embodiments of the present disclosure can be adopted.

Figure 32:
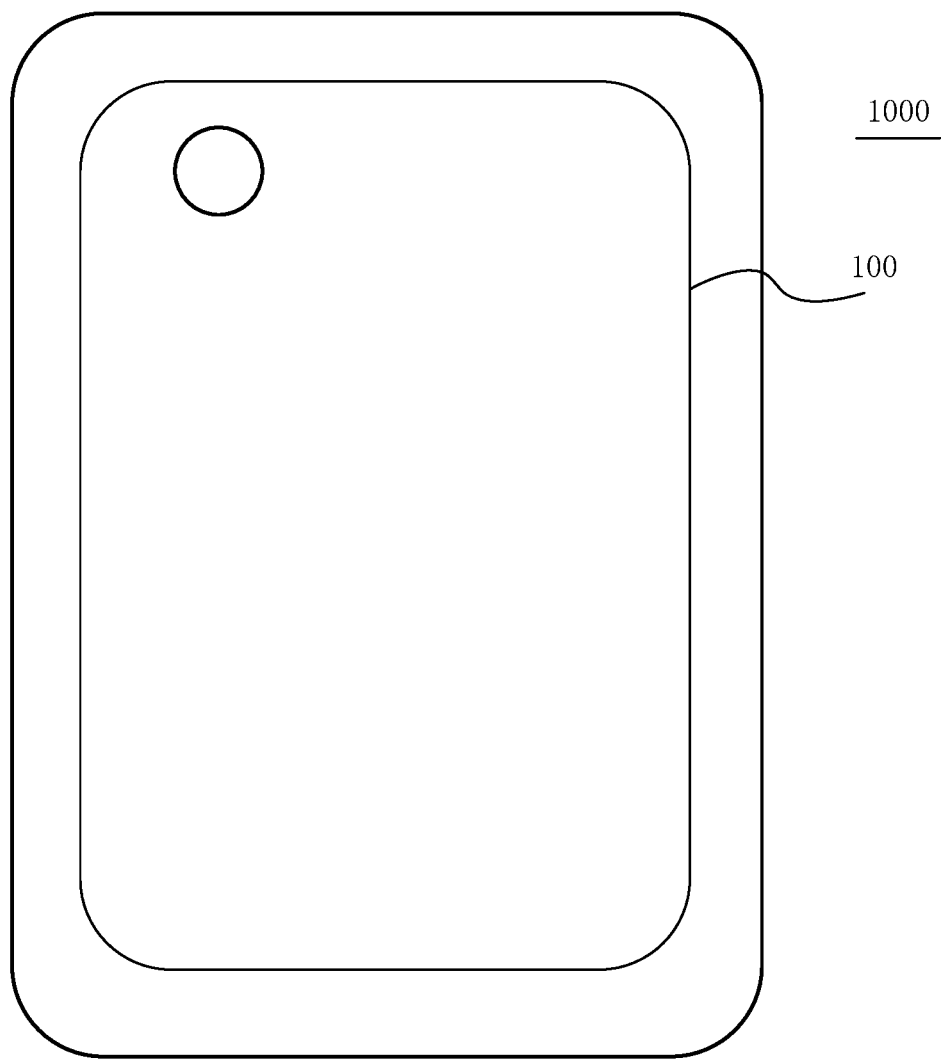
FIG. 32 illustrates an exemplary display device consistent with various disclosed embodiments in the present disclosure.

The present disclosure also provides a display device. As shown in FIG. 32, the display device 1000 may include a display panel 100 provided by various embodiments of the present disclosure. The embodiment in FIG. 32 where the display device 1000 is a cell phone are used as an example to illustrate the present disclosure, and does not limit the scope of the present disclosure. In various embodiments, the display device 1000 may be a computer, a television, a vehicle display device, or any device with display functions.

In the display panel and the display device provided by the present disclosure, the first connecting lines may be located in the first frame area. Each of the first connecting line may include a first end connected to the crack detection line and a second end away from the first end. The distance between the two first ends may be larger than the two second ends. A small distance between the two second may be beneficial for the subsequent connecting line connected with the second end of the first connecting line to be led to the display area, reducing the occupied space of the distance between the two first connecting lines in the first frame. The impact on other components in the first frame may also be reduced. For example, the influence on the compensation module provided in the first frame for compensating the irregularly-shaped touch-control electrodes may be reduced, or the influence on the part of the touch-control wire extending through the first frame for connecting the plurality of touch-control electrodes may be reduced. Also, a large distance between the two first ends can effectively increases the distance between the two first connection lines, thereby reducing the risk of short circuit between the two first connection lines, and effectively avoiding the failure of the crack detection function.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
   a display area, a light transmission area, and a first frame area, wherein the first frame area surrounds the light transmission area and the display area surrounding the first frame area;
   a crack detection line in the first frame area, wherein at least a portion of the crack detection line extends along a circumferential direction of the light transmission area; and
   a plurality of first connection lines, wherein:
      the crack detection line is connected to two first connection lines of the plurality of first connection lines;
      each first connection line of the two first connection lines includes a first end connected to the crack detection line and a second end away from the first end; and
      a distance between two first ends of the two first connection lines is larger than a distance between two second ends of the two first connection lines.

2. The display panel according to claim 1, further including a step structure, wherein:
   the step structure is located in the first frame area;
   the crack detection line is located between the step structure and the light transmission area; and
   the plurality of first connection lines overlap the step structure.

3. The display panel according to claim 1, further including a barrier wall in the first frame area, wherein:
   the barrier wall surrounds the light transmission area;
   the crack detection line is located between the barrier wall and the light transmission area; and
   along a direction perpendicular to the display panel, the plurality of first connection lines and the barrier wall partially overlap.

4. The display panel according to claim 3, wherein:
   along a direction from the first ends to the second ends, the two first connecting lines extend toward each other gradually.

5. The display panel according to claim 3, wherein:
   the first ends are located between the barrier wall and the light transmission area, and the second ends are located between the barrier wall and the display area.

6. The display panel according to claim 1, further including two second connection lines in the display area, wherein:
   each of the two second connection lines is connected to a second end of a corresponding one of the two first connection lines respectively.

7. The display panel according to claim 6, further including:
   a second frame area surrounding the display area;
   at least two soldering pads in the second frame area;
   third connection lines in the second frame area, wherein the two second connection lines are connected to the at least two soldering pads through different third connection lines respectively.

8. The display panel according to claim 1, further including:
   a base substrate, a light-emitting layer, and an encapsulation layer, disposed sequentially, wherein the crack detection line and the plurality of first connection lines are disposed on a side of the encapsulation layer away from the base substrate.

9. The display panel according to claim 8, wherein:
   a surface of the encapsulation layer away from the base substrate is recessed to form a groove in a direction toward the base substrate;
   the groove is located in the first frame area;
   the first ends are located between the groove and the light transmission area; and
   the second ends are located between the groove and the display area.

10. The display panel according to claim 9, wherein:
    the encapsulation layer includes a first encapsulation layer and a second encapsulation layer;
    the first encapsulation layer surrounds the second encapsulation layer;
    an interface between the first encapsulation layer and the second encapsulation layer is located in the first frame area; and
    the groove is located at the interface of the first encapsulation layer and the second encapsulation layer.

11. The display panel according to claim 10, wherein:
    the second encapsulation layer is at least partially located on a side of the first encapsulation layer away from the base substrate;
    along a direction from the display area to the light transmission area, the first encapsulation layer includes a first inclined surface at a side of the first encapsulation layer close to the second encapsulation layer;
    the first inclined surface is located on a side of the first encapsulation layer away from the base substrate;
    the first inclined surface is gradually inclined toward the base substrate along the direction from the display area to the light transmission area;
    the second encapsulation layer covers a portion of the first inclined surface;
    along a direction from the light transmission area to the display area, the second encapsulation layer includes a second inclined surface located on a side of the second encapsulation layer close to the first encapsulation layer;
    the second inclined surface is located on a side of the second encapsulation layer away from the base substrate;
    the second inclined surface is gradually inclined toward the base substrate along the direction from the light transmission area to the display area; and
    in the direction perpendicular to the display panel, the first inclined surface partially overlaps the second inclined surface, and the first inclined surface and the second inclined surface form the groove.

12. The display panel according to claim 9, further including a barrier wall between the groove and the light transmission area.

13. The display panel according to claim 1, further including a touch-control layer, wherein:
    the crack detection line and at least one of the two first detection lines are located in the touch-control layer.

14. The display panel according to claim 13, wherein:
    the touch-control layer includes a plurality of touch-control electrodes;
    the plurality of touch-control electrodes includes regular touch-control electrodes and irregularly-shaped touch-control electrodes; and
    the irregularly-shaped touch-control electrodes are adjacent to the first frame area.

15. The display panel according to claim 14, wherein:
    the touch-control layer further includes compensation structures between the crack detection line and the display area; and
    an irregularly-shaped touch-control electrode is electrically connected to at least one of the compensation structures.

16. The display panel according to claim 15, wherein:
the touch-control layer includes a first metal layer;
the plurality of touch-control electrodes and the compensation structures are located in the first metal layer;
the crack detection line and the first connection lines are located in the first metal layer; and
in the direction perpendicular to the display panel, the two first connecting lines and the compensation structure do not overlap.

17. The display panel according to claim 16, further including a second metal layer and a compensation part, wherein:
along the circumferential direction of the light transmission area, one of the compensation structures adjacent to the first connection lines is a first compensation structure;
the first compensation structure includes a first edge, and along the direction from the display area to the light transmission area, the first edge is located on a side of the first compensation structure close to the light transmission area;
the first metal layer includes a missing area;
along an extending direction of the first edge, the missing area is located on a side of the first compensation structure close to the first connecting lines;
the compensation part is located on the second metal layer;
in the direction perpendicular to the display panel, the compensation part and the missing area at least partially overlap; and
the compensation part is electrically connected to the first compensation structure.

18. The display panel according to claim 16, further including a second metal layer and a compensation part, wherein:
along the circumferential direction of the light transmission area, one of the compensation structures adjacent to the first connection lines is a first compensation structure;
each irregularly-shaped touch-control electrode includes a second edge adjacent to the first frame area;
the first compensation structure is connected to the irregularly-shaped touch-control electrodes through second edges;
an area adjacent to first segments of second edges of at least one of the irregularly-shaped touch-control electrodes forms a missing area;
the missing area is not provided with the first compensation structure;
the first connection lines extend through the missing area;
the compensation part is located on the second metal layer;
in the direction perpendicular to the display panel, the compensation part and the missing area at least partially overlap; and
the compensation part is electrically connected to the first compensation structure.

19. The display panel according to claim 15, wherein:
the touch-control layer includes a first metal layer and a second metal layer;
the plurality of touch-control electrodes, the compensation structures, and the crack detection line are located in the first metal layer;
the plurality of first connection lines are located in the second metal layer;
the first connection lines and the crack detection line are electrically connected via through holes; and
in the direction perpendicular to the display panel, the plurality of first connection lines partially overlap the compensation structures.

20. The display panel according to claim 1, wherein:
the crack detection line includes a first winding portion, a second winding portion, and first connecting portions;
the first winding portion extends in a circumferential direction of the light transmission area and is provided with a second gap;
the second winding portion is located between the first winding portion and the light transmission area, and extends in the circumferential direction of the light transmission area;
the second winding portion is provided with a second gap;
the first gap and the second gap are adjacent;
the first winding portion includes two third ends forming the first gap;
the second winding portion includes two fourth ends forming the second gap;
the third ends and the fourth ends are in one-to-one correspondence;
a pair of one third end and one corresponding fourth end are connected through one corresponding first connection portion;
two ends of the crack detection line form a third gap on the second winding portion; and
the third gap is not adjacent to the second gap.

21. The display panel according to claim 20, wherein:
the crack detection line further includes a third winding portion and second connecting portions;
the second winding portion is further provided with a fourth gap;
the third winding portion is located between the second winding portion and the light transmission area, and extends in the circumferential direction of the light transmission area;
the third winding portion is provided with a fifth gap;
the fourth gap and the fifth gap are adjacent;
the second winding portion includes two fifth ends forming the fourth gap;
the third winding portion includes two sixth ends forming the fifth gap;
the fifth ends and the sixth ends are in one-to-one correspondence;
a pair of one fifth end and one corresponding sixth end are connected through one corresponding second connection portion;
two ends of the crack detection line form a third gap on the second winding portion; and
the fifth gap is not adjacent to the second gap and the third gap.

22. The display panel according to claim 1, further including a first detection line surrounding the crack detection line, wherein:
the crack detection line extends in a circumferential direction of the light transmission area;
both ends of the crack detection line are seventh ends;
two seventh ends form a third gap on the crack detection line;
the first detection line extends in the circumferential direction of the light transmission area;
a sixth gap is provided on the first detection line;
the third gap and the sixth gap are adjacent;
the first detection line includes two eighth ends forming the sixth gap;
the seventh ends and the eighth ends are in one-to-one correspondence;

a pair of one seventh end and one corresponding eighth end are connected through one first connection line.

23. A display device, comprising a display panel, wherein: the display panel includes:
- a display area, a light transmission area, and a first frame area, wherein the first frame area surrounds the light transmission area and the display area surrounding the first frame area;
- a crack detection line in the first frame area, wherein at least a portion of the crack detection line extends along a circumferential direction of the light transmission area; and
- a plurality of first connection lines, wherein:
- the crack detection line is connected to two first connection lines of the plurality of first connection lines;
- each first connection line includes a first end connected to the crack detection line and a second end away from the first end;
- a distance between two first ends of the two first connection lines is larger than a distance between two second ends of the two first connection lines.

* * * * *